United States Patent
Kim et al.

(10) Patent No.: US 12,161,038 B2
(45) Date of Patent: Dec. 3, 2024

(54) DISPLAY DEVICE

(71) Applicant: Samsung Display Co., LTD., Yongin-si (KR)

(72) Inventors: Hyun Ho Kim, Yongin-si (KR); Dong Uk Kim, Yongin-si (KR); Hoon Gi Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/120,077

(22) Filed: Mar. 10, 2023

(65) Prior Publication Data
US 2024/0032380 A1    Jan. 25, 2024

(30) Foreign Application Priority Data
Jul. 21, 2022    (KR) ......................... 10-2022-0090260

(51) Int. Cl.
*H10K 59/60*    (2023.01)
*H10K 59/122*   (2023.01)
*H10K 59/80*    (2023.01)

(52) U.S. Cl.
CPC ........... *H10K 59/60* (2023.02); *H10K 59/122* (2023.02); *H10K 59/87* (2023.02)

(58) Field of Classification Search
CPC ....... H10K 59/60; H10K 59/87; H10K 59/122
See application file for complete search history.

(56) References Cited

U.S. PATENT DOCUMENTS

| | | | | |
|---|---|---|---|---|
| 2002/0093284 A1* | 7/2002 | Adachi | ............... | H10K 50/868 |
| | | | | 313/506 |
| 2004/0178722 A1* | 9/2004 | Cok | ..................... | H10K 50/824 |
| | | | | 313/506 |
| 2010/0148192 A1* | 6/2010 | Jung | ..................... | H10K 50/865 |
| | | | | 257/59 |
| 2011/0316007 A1* | 12/2011 | Sagawa | ............... | H10K 50/805 |
| | | | | 257/E33.062 |
| 2018/0033847 A1* | 2/2018 | Kim | ..................... | H10K 59/122 |
| 2018/0081473 A1* | 3/2018 | Seo | ........................ | G06F 1/3287 |
| 2019/0036047 A1* | 1/2019 | Zhou | ..................... | H10K 50/15 |

OTHER PUBLICATIONS

Meerheim et al., "Quantification of energy loss mechanisms in organic light-emitting diodes", Applied Physics Letters, Dec. 22, 2010, pp. 1-3, vol. 97, No. 25.

* cited by examiner

*Primary Examiner* — Mary Ellen Bowman
(74) *Attorney, Agent, or Firm* — KILE PARK REED & HOUTTEMAN PLLC

(57) ABSTRACT

A display device includes a substrate, a first planarization layer disposed on a surface of the substrate, a second planarization layer disposed on a surface of the first planarization layer, a light-emitting element including a pixel electrode disposed on the surface of the second planarization layer, an emissive layer disposed on a surface of the pixel electrode, and a common electrode disposed on a surface of the emissive layer, a connection electrode disposed on the surface of the first planarization layer and electrically connecting the surface of the first planarization layer with an opposite surface of the first planarization layer through a first contact hole, and a light-absorbing layer disposed on the surface of the first planarization layer and covered by the second planarization layer.

21 Claims, 16 Drawing Sheets

RA: RA_1
SD: SD_1, SD_2
SD_1: SD_1a, SD_1b

DA: DA_1, DA_2
SD: SD_1, SD_2
RA: RA_1
SD_1: SD_1a, SD_1b

DM: PNL, SM
PNL: AA, NAA, SBA
AA: AA_1, AA_2, AA_3
SM: MP, SP_1, SP_2, SG
SD_1: SD_1a, SD_1b

SD_1: SD_1a, SD_1b
SD_1a: P1, P2
SD_1b: P1, P2
SD_3: SD_3a, SD_3b, SD_3c
SD_3a: GR2, H
SD_3b: GR2, H

DISPLAY DEVICE

CROSS REFERENCE TO RELATED APPLICATION(S)

This application claims priority from Korean Patent Application No. 10-2022-0090260 under 35 U.S.C. § 119, filed on Jul. 21, 2022 in the Korean Intellectual Property Office, the disclosure of which is incorporated herein by reference in its entirety.

BACKGROUND

1. Technical Field of the Disclosure

The disclosure relates to a display device.

2. Description of the Related Art

As display devices, a liquid-crystal display (LCD), a plasma display panel (PDP) display, an organic light-emitting diode (OLED) display, a field effect display (FED), an electrophoretic display, etc. are known.

Among these, an organic light-emitting diode display is self-luminous and thus does not require a separate light source, unlike a liquid-crystal display. Therefore, the thickness and weight can be reduced. In addition, an organic light-emitting diode display has high-quality characteristics such as low power consumption, high luminance, and fast response speed.

Recently, as the usage environment of portable electronic devices, such as smartphones, is diversified into writing documents, web browsing, electronic games, viewing multimedia contents, and so on, the usage time and frequency of display devices are increasing. Accordingly, there is an urgent need to improve the power consumption of such display devices.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device with improved power consumption by way of increasing the power output of solar cells by widening the area of light-absorbing layers of the solar cells with a simple structure.

Aspects of the disclosure also provide a display device in which light-absorbing layers are disposed under light-emitting elements so that light emitted downward from the light-emitting elements as well as external light can be used to charge solar cells.

It should be noted that aspects of the disclosure are not limited to the above-mentioned aspects; and other aspects of the disclosure will be apparent to those skilled in the art from the following descriptions.

According to the embodiments of the disclosure, it is possible to improve the power consumption of a display device by way of increasing the power output of solar cells by widening the area of light-absorbing layers of the solar cells.

According to the embodiments of the disclosure, light-absorbing layers are disposed under light-emitting elements in a display device so that light emitted downward from the light-emitting elements as well as external light can be used to charge solar cells.

An embodiment of a display device includes a first planarization layer disposed on a surface of a substrate, a second planarization layer disposed on a surface of the first planarization layer, a light-emitting element comprising a pixel electrode disposed on a surface of the second planarization layer, an emissive layer disposed on a surface of the pixel electrode, and a common electrode disposed on a surface of the emissive layer, a connection electrode disposed on the surface of the first planarization layer and electrically connecting the surface of the first planarization layer with an opposite surface of the first planarization layer through a first contact hole, and a light-absorbing layer disposed on the surface of the first planarization layer and covered by the second planarization layer.

An embodiment of a display device may further a pixel-defining layer disposed on the surface of the second planarization layer, not overlapping the emissive layer in a thickness direction and covering the second planarization layer, the light-absorbing layer at least partially overlaps the pixel-defining layer in the thickness direction, and the connection electrode is configured to operate as a first electrode of the light-absorbing layer, and the pixel electrode is configured to operate as a second electrode of the light-absorbing layer.

The light-absorbing layer may comprise a first light-absorbing layer overlapping the emissive layer in the thickness direction and a second light-absorbing layer not overlapping the emissive layer in the thickness direction, the second light-absorbing layer comprises a (2-1) light-absorbing layer and a (2-2) light-absorbing layer disposed on a side of the (2-1) light-absorbing layer in the first direction, and the (2-1) light-absorbing layer and the (2-2) light-absorbing layer are electrically connected in parallel.

The first light-absorbing layer may comprise a (1-1) light-absorbing layer and a (1-2) light-absorbing layer disposed adjacent to each other in a second direction intersecting the first direction, and the (1-1) light-absorbing layer and the (1-2) light-absorbing layer are electrically connected in series.

The pixel electrode may be disposed between the (1-1) light-absorbing layer and the (1-2) light-absorbing layer.

The pixel electrode may be disposed between a side surface of the first light-absorbing layer and a side surface of the second light-absorbing layer.

The second planarization layer may cover the side surface of the first light-absorbing layer and the side surface of the second light-absorbing layer.

The side surface of the first light-absorbing layer may be spaced apart from the pixel electrode.

The light-absorbing layer may be in direct contact with the connection electrode.

The light-absorbing layer may be in direct contact with the pixel electrode.

A distance from the substrate to the light-absorbing layer may be smaller than a distance from the substrate to the emissive layer.

The light-absorbing layer may overlap the emissive layer at least partially in the thickness direction.

The light-absorbing layers may cover at least eighty percent (80%) of the surface of the first planarization layer.

According to an embodiment of a display device includes a display panel configured to slide in a first direction, and a panel storage having a guide rail configured to guide a sliding motion of the display panel in the first direction, the display panel comprises a first display part having a flat shape, and a second display part disposed on a side of the first display part in the first direction and having a curvature, and the first display part comprises a light-absorbing layer, a connection electrode in direct contact with a surface of the light-absorbing layer, and a pixel electrode in direct contact with an opposite surface of the light-absorbing layer.

An embodiment of a display device may further an emissive layer disposed on a surface of the pixel electrode, the light-absorbing layer at least partially overlaps with the emissive layer in a thickness direction, and the connection electrode is configured to operate as a first electrode of the light-absorbing layer, and the pixel electrode is configured to operate as a second electrode of the light-absorbing layer.

An embodiment of a display device may further a pixel-defining layer disposed on the surface of the pixel electrode and not overlapping the emissive layer in the thickness direction, wherein the light-absorbing layer at least partially overlaps the pixel-defining layer in the thickness direction.

The light-absorbing layer may comprise a first light-absorbing layer overlapping the emissive layer in the thickness direction and a second light-absorbing layer not overlapping the emissive layer in the thickness direction, and the pixel electrode is disposed between the first light-absorbing layer and the second light-absorbing layer.

The light-absorbing layer may convert light energy of external light incident on the first display part and internal light emitted by the emissive layer into electrical energy. The second display part may comprise an auxiliary light-absorbing layer.

The light-absorbing layer may comprise a first light-absorbing layer overlapping with the emissive layer in a thickness direction and a second light-absorbing layer not overlapping with the emissive layer in the thickness direction, the auxiliary light-absorbing layer comprises a first auxiliary light-absorbing layer and a second auxiliary light-absorbing layer overlapping the emissive layer in the thickness direction, and a distance between the first light-absorbing layer and the second light-absorbing layer is smaller than a distance between the first auxiliary light-absorbing layer and the second auxiliary light-absorbing layer.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1A:
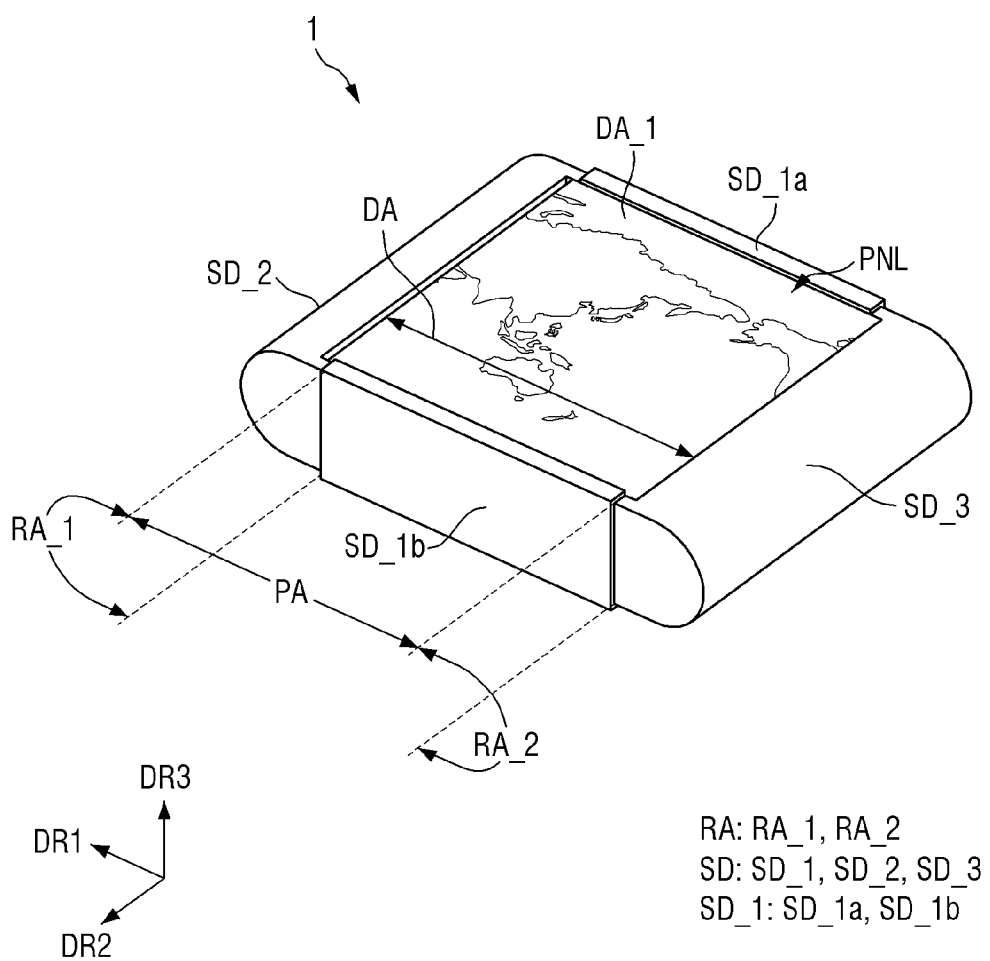
FIG. 1A is a perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will also be understood that when an element (or a region, a layer, a portion, or the like) is referred to as being "on", "connected to" or "coupled to" another element in the specification, it can be directly disposed on, connected or coupled to another element mentioned above, or intervening elements may be present disposed therebetween. In contrast, when an element is referred to as being "directly on" another element, there are no intervening elements present.

It will be understood that the terms "connected to" or "coupled to" may include a physical or electrical connection or coupling.

It will be understood that, although the terms "first," "second," "third," or the like may be used herein to describe various elements, these elements should not be limited by these terms. These terms are only used to distinguish one element from another element. For example, "a first element" may be referred to as "a second element" or "a third element," and similarly "a second element" or "a third element" may be referred to as a "first element" without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

Hereinafter, embodiments of the disclosure will be described with reference to the accompanying drawings.

Figure 1B:
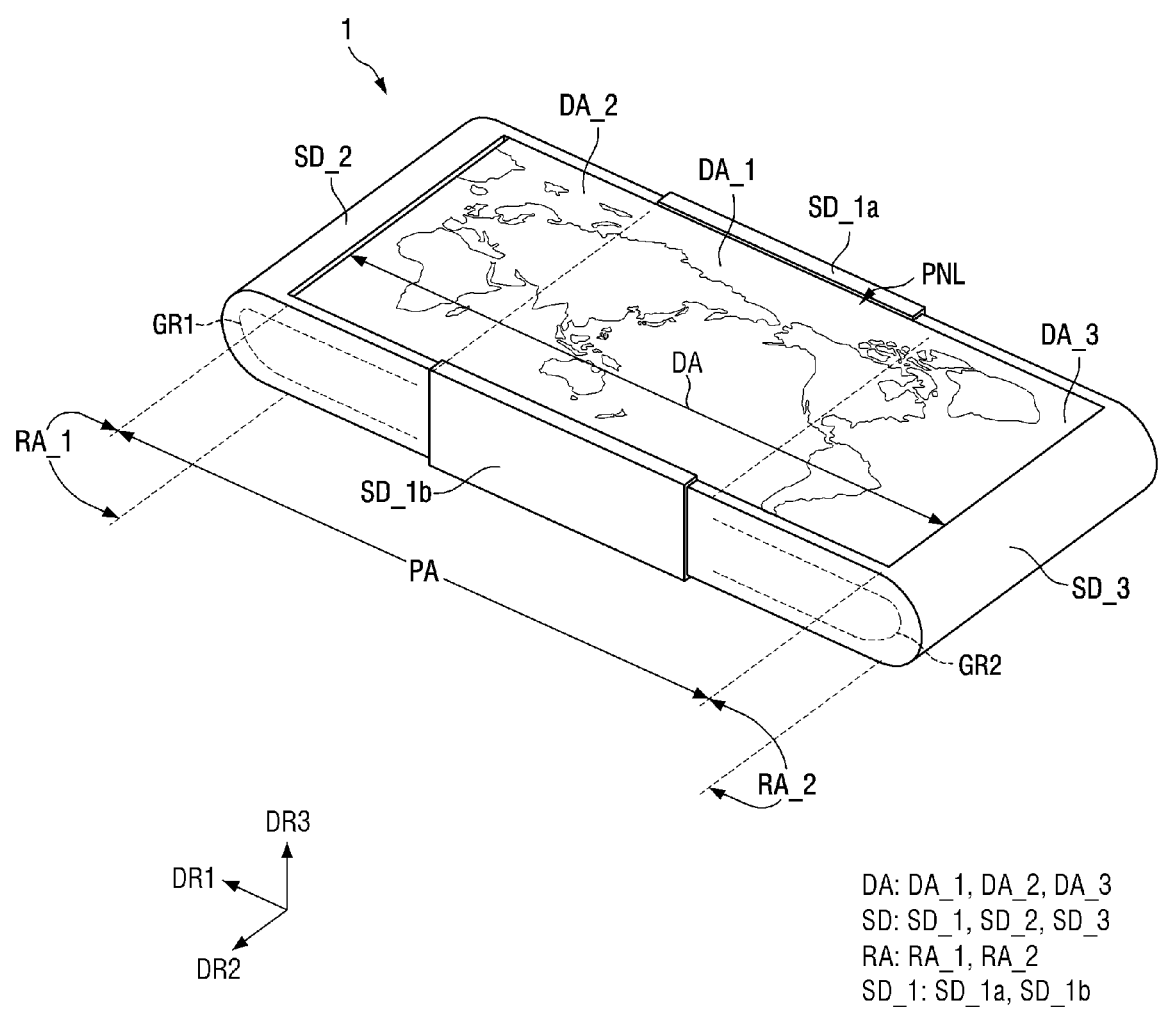
FIG. 1B is a perspective view of the display device according to the embodiment in case that it is expanded.
Figure 2A:
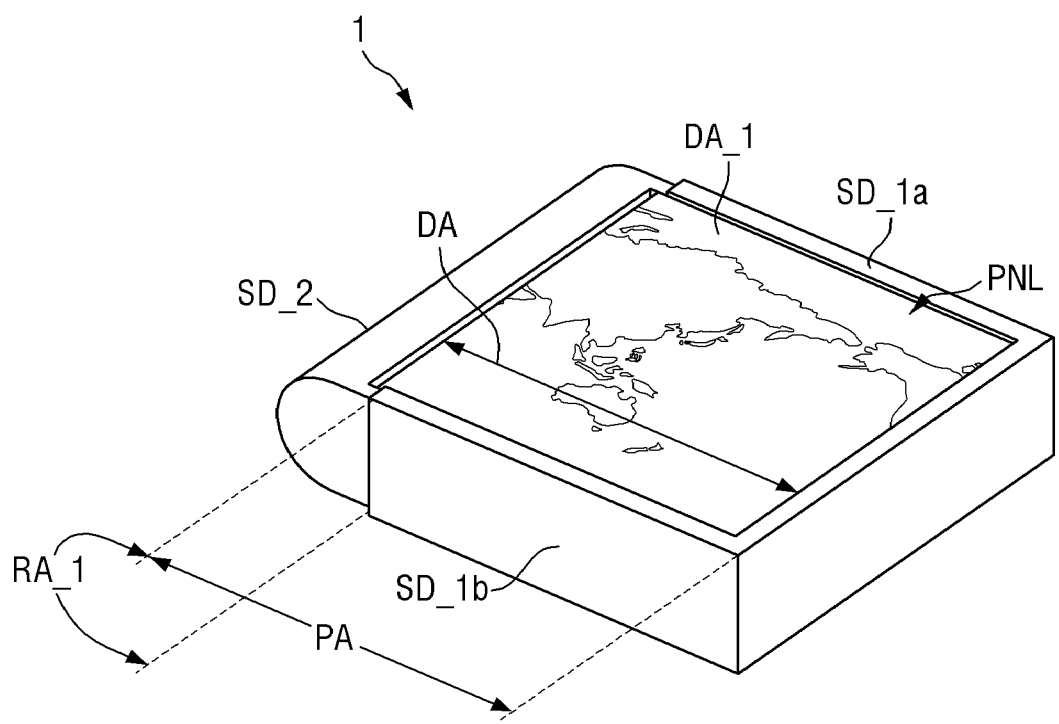
FIG. 2A is a perspective view showing a display device according to another embodiment of the disclosure.
Figure 2A:
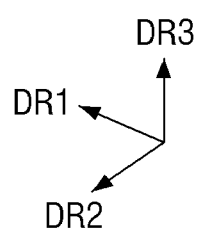
Figure 2B:
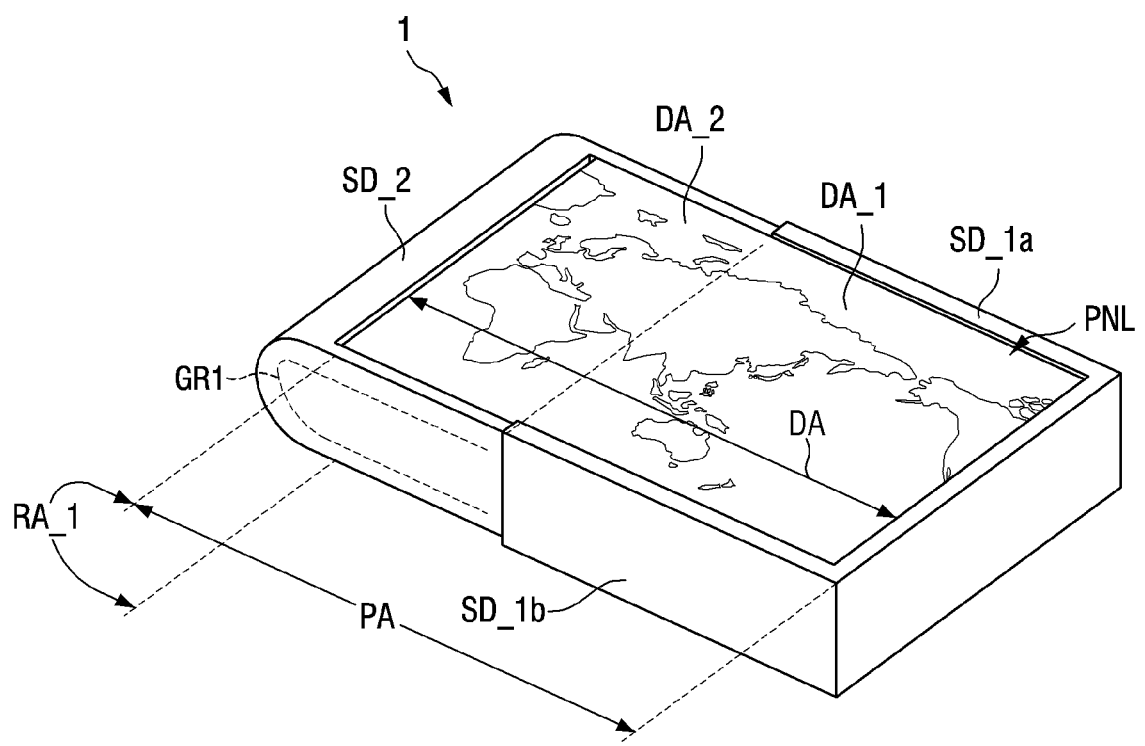
FIG. 2B is a perspective view showing the display device according to the embodiment of FIG. 2A in case that it is expanded.
Figure 2B:
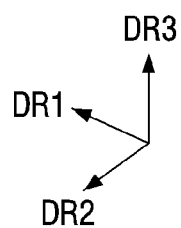
Figure 3:
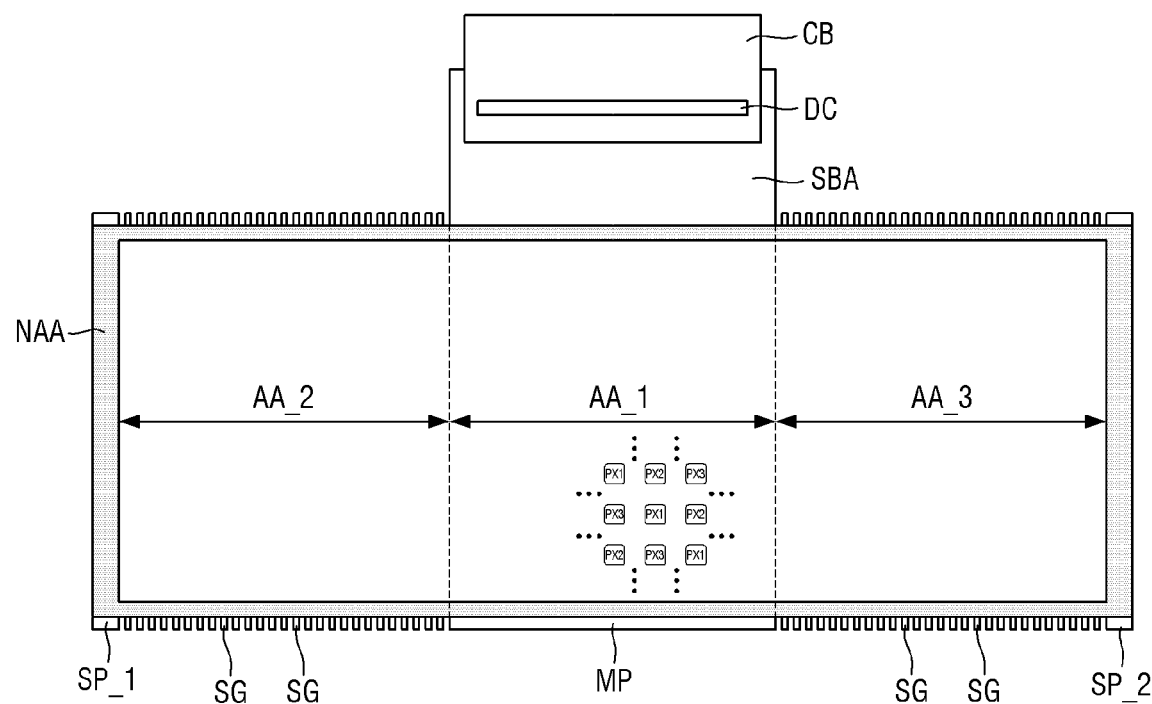
FIG. 3 is a plan view of a display module of the display device according to the embodiment of the disclosure.
Figure 3:
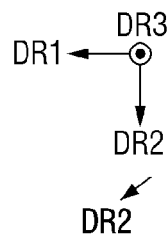
Figure 4:
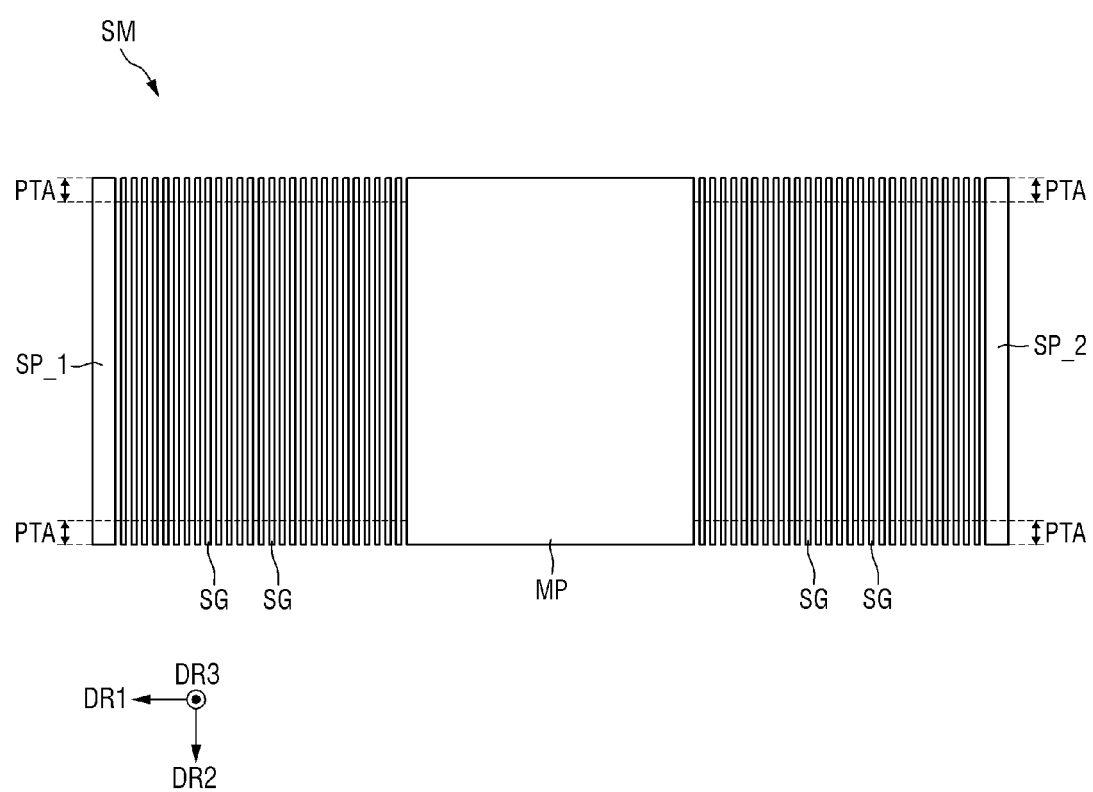
FIG. 4 is a plan view of a panel support of a display module according to an embodiment of the disclosure.
Figure 5:
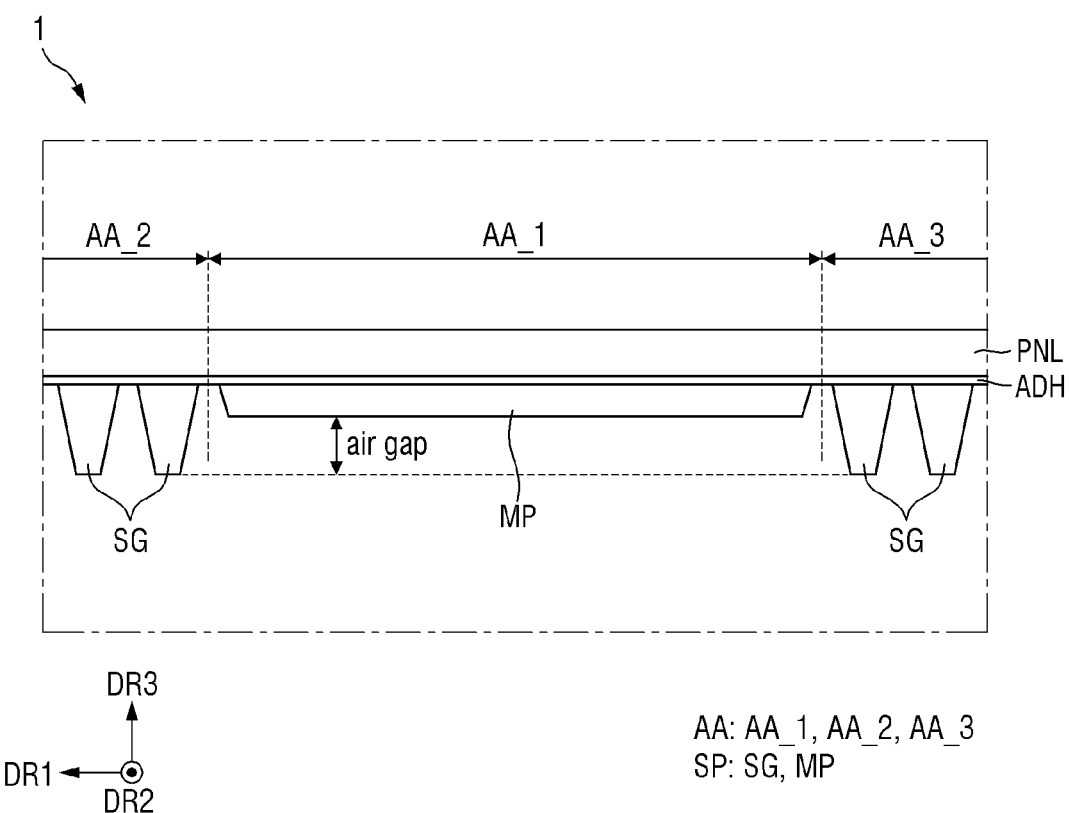
FIG. 5 is a side view of a display module according to an embodiment of the disclosure.

FIG. 1A is a perspective view of a display device according to an embodiment of the disclosure. FIG. 1B is a perspective view of the display device according to the embodiment in case that it is expanded. FIG. 2A is a perspective view showing a display device according to another embodiment of the disclosure. FIG. 2B is a perspective view showing the display device according to the embodiment of FIG. 2A in case that it is expanded. FIG. 3 is a plan view of a display module of the display device according to the embodiment of the disclosure. FIG. 4 is a plan view of a panel support of a display module according to an embodiment of the disclosure. FIG. 5 is a side view of a display module according to an embodiment of the disclosure.

In FIGS. 1A and 1B, a first direction DR1, a second direction DR2 and a third direction DR3 are defined. The first direction DR1 and the second direction DR2 are perpendicular to each other, the first direction DR1 and the third direction DR3 are perpendicular to each other, and the second direction DR2 and the third direction DR3 may be perpendicular to each other. The first direction DR1 may refer to the horizontal direction in the drawings, the second direction DR2 may refer to the vertical direction in the drawings, and the third direction DR3 may refer to the up-and-down direction, i.e., the thickness direction in the drawings. As used herein, a direction may refer to the direction indicated by the arrow as well as the opposite direction, unless specifically stated otherwise. If it is necessary to discern between such two opposite directions, one of the two directions may be referred to as "one side in the direction," while the other direction may be referred to as "the opposite side in the direction". As shown in FIG. 1A, the side indicated by the arrow of a direction is referred to as one side in the direction, while the opposite side is referred to as the opposite side in the direction.

In the following description of the surfaces of the display device 1 or the elements of the display device 1, the surfaces facing one side where images are displayed, i.e., the third direction DR3 will be referred to as the upper surface, while the opposite surfaces will be referred to as the lower surface for convenience of illustration. It should be understood, however, that the disclosure is not limited thereto. The surfaces and the opposite surface of the elements may be referred to as a front surface and a rear surface, respectively, or may be referred to as a first surface and a second surface, respectively. In addition, in the description of relative positions of the elements of the display device 1, one side in the second direction DR2 may be referred to as the upper side while the opposite side in the third direction DR3 may be referred to as the lower side.

Referring to FIGS. 1A and 1B, the display device 1 according to the embodiment may be a sliding display device or a slidable display device that can slide in the first direction DR1. The display device 1 according to the embodiment may be, but is not limited to, a multi-slidable display device that is configured to slide in two directions. For example, the display device 1 may be a single slidable display device configured to slide only in one direction as shown in FIGS. 2A and 2B. In the following description, a multi-slidable display device will be described as the display device 1 according to the embodiment. A description that a component is "configured to" perform a specified operation may be defined as a case where the component is constructed and arranged with structural features that can cause the component to perform the specified operation.

The display device 1 may include a plane area PA and rounded areas RA. The plane area PA of the display device 1 generally overlaps with an open area of a panel storage SD where a display panel PNL is exposed, which will be described later. The rounded areas RA of the display device 1 may be located inside the panel storage SD. The rounded areas RA may be curved with a predetermined radius of curvature, and the display panel PNL may be curved according to the radius of curvature. The round areas RA may be disposed on the both sides of the plane area PA in the first direction DR1, respectively. Specifically, a first round area RA_1 may be disposed on the opposite side of the plane area PA in the first direction DR1 while a second round area RA_2 may be disposed on one side of the plane area PA in the first direction DR1. In the first rounded area RA_1, a second active area (AA_2 of FIG. 3) of the display panel PNL, which will be described later, may be bent. In the second rounded area RA_2, a third active area (AA_3 of FIG. 3) of the display panel, which will be described later, may be bent. As shown in FIG. 1B, the plane area PA may increase as the display device 1 expands. Accordingly, the distance between the first rounded area RA_1 and the second rounded area RA_2 may increase.

Referring to FIGS. 1A to 5, the display device according to the embodiment may include a display module DM, and a panel storage SD.

The display module DM may include a display panel PNL and a panel support SM.

The display panel PNL of the display module DM includes pixels PX to display images thereon. Any kind of display panel may be employed as the display panel PNL according to the embodiment, such as an organic light-emitting display panel including an organic light-emitting layer, a micro light-emitting diode display panel using micro LEDs, a quantum-dot light-emitting display panel using quantum-dot light-emitting diodes including quantum-dot light-emitting layer, and an inorganic light-emitting display panel using inorganic light-emitting elements including an inorganic semiconductor.

The display panel PNL may be a flexible panel. The display panel PNL may have flexibility so that it can be partially rolled, bent or curved in the panel storage SIDE. The display panel PNL may slide in the first direction DR1.

The display panel PNL may include an active area AA and a non-active area NAA. The display panel PNL comprises, within the active area AA, a first active area AA_1, a second active area AA_2, and a third active area AA_3.

In the active area AA of the display panel PNL, pixels PX may be disposed. The active area AA may include a first active are AA_1 (also referred to herein as a first display unit) supported by a main plate MP, which will be described later, a second active area AA_2 (also referred to herein as a second display unit) supported by segments SG, and a third active area AA_3 (also referred to herein as a third display unit) supported by segments SG. The first active area AA_1 of the display panel PNL may be always flat that maintains a flat shape regardless of the sliding motion.

Each of the second active area AA_2 and the third active area AA_3 of the display panel PNL may be either a bent area that is rolled, bent or curved, or a bendable area changing between a rolled, bent or curved shape and a flat shape according to the sliding motion of the display device 1. The second active area AA_2 and the third active area AA_3 of the display panel PNL may be bent by rollers R.

In the display area DA of the display panel PNL, images may be displayed. The display area DA may be divided into a first display area DA_1, a second display area DA_2 and a third display area DA_3 depending on whether the display panel PNL slides or not and on how long or far it slides if it does. The presence of the second display area DA_2 and the third display area DA_3 may depend on whether the display panel PNL slides or not, and the areas of them may vary depending on how long or far it slides. Specifically, in a case that the display panel PNL does not slide, it has the first display area DA_1 having a first area. In case that the display panel PNL slides, the display area DA further includes the expanded second display area DA_2 and third display area DA_3 in addition to the first display area DA_1.

The first display area DA_1 may overlap with the first active area AA_1 of the display panel PNL. The second display area DA_2 may overlap with at least a part of the second active area AA_2 of the display panel PNL. The third display area DA_3 may overlap with at least a part of the third active area AA_3 of the display panel PNL. Specifically, in the second display area DA_2, the second active area AA_2 of the display panel PNL and the plane area PA may overlap each other. In the third display area DA_3, the third active area AA_3 of the display panel PNL and the plane area PA may overlap each other.

In some embodiments, the boundary between the first display area DA_1 and the second display area DA_2 may coincide with the boundary between the first active area AA_1 and the second active area AA_2, and the boundary between the first display area DA_1 and the second display area DA_2 may coincide with the boundary between the first active area AA_1 and the third active area AA_3. It should be understood, however, but the disclosure is not limited thereto.

The areas of the second display area DA_2 and the third display area DA_3 may vary depending on how long the display device 1 slides. For example, in a case that the display device 1 slides to the maximum, the second display area DA_2 has a second area, the third display area DA_3 has a third area, and the display area DA has a fourth area which is the sum of the first area, the second area and the third area. The fourth area may be the maximum area that the display area DA can have.

In the non-active area NAA of the display panel PNL, no pixel PX may be disposed. In the non-active area NAA, metal lines such as a data/scan lines, touch lines and supply voltage lines may be disposed.

The display panel PNL may further include a subsidiary area SBA. The subsidiary area SBA may be disposed on the opposite side of the first active area AA_1 of the display panel PNL in the second direction DR2. In other words, the subsidiary area SBA may protrude from the non-active area NAA toward the opposite side in the second direction DR2.

The subsidiary area SBA may overlap with the first active are AA_1 in the second direction DR2 and may not overlap with the second active area AA_2 and the third active area AA_3 in the second direction DR2.

In some embodiments, the subsidiary area SBA may have, but is not limited to, a rectangular shape when viewed from the top. In some embodiments, the length of the subsidiary area SBA in the first direction DR1 may be substantially equal to the length of the first active area AA_1 in the first direction DR1. It should be understood, however, that the disclosure is not limited thereto. Alternatively, the length of the subsidiary area SBA in the first direction DR1 may be smaller than the length of the first active area AA_1 in the first direction DR1. The length of the subsidiary area SBA in the second direction DR2 may be smaller than the length of the first active area AA_1 in the second direction DR2.

The subsidiary area SBA may be a folded, curved or bent. In case that the subsidiary area SBA is bent, the subsidiary area SBA may be disposed in the space in which the second active area AA_2 and the third active area AA_3 of the display panel PNL are bent and may overlap with the first active area AA_1 in the third direction DR3. With the above-described configuration, the display device 1 according to the embodiment can have a large internal space while reducing the thickness in a case that the display panel PNL is bent.

A driver circuit DC and a circuit board CB may be disposed on one surface of the subsidiary area SBA in the third direction DR3.

The circuit board CB may be attached on the upper surface of the subsidiary area SBA using an anisotropic conductive film (ACF). The circuit board CB may be electrically connected to a pad area formed on the subsidiary area SBA. The circuit board CB may be a flexible printed circuit board (FPCB), a printed circuit board (PCB), or a flexible film such as a chip-on-film (COF).

The driver circuit DC may be implemented as an integrated circuit (IC) and may be attached to the subsidiary area SBA by a chip-on-glass (COG) technique, a chip-on-plastic (COP) technique, or ultrasonic bonding. Alternatively, the driver circuit DC may be mounted on the circuit board CB.

The panel support SM of the display module DM may support the bottom surface of the display panel PNL. The panel support SM may be attached to the bottom surface of the display panel PNL to support the display panel PNL.

An adhesive ADH may be interposed between the panel support SP and the display panel PNL. In some embodiments, the adhesive ADH may be, but is not limited to, a pressure sensitive adhesive (PSA). The panel support SM may include a main plate MP, a first sub-plate SP_1, a second sub-plate SP_2, and segments SG.

The main plate MP may support the first active area AA_1 of the display panel PNL. Specifically, the main plate MP may support the first active area AA_1 of the display panel PNL as well as a part of the non-active area NAA surrounding the first active area AA_1. The main plate MP may be disposed between the segments SG supporting the second active area AA_2 and the segments SG supporting the third active area AA_3. The main plate MP and the first active area AA_1 of the display panel PNL may overlap each other in the third direction DR3.

The main plate MP may have a plane shape extended in the first direction DR1 and the second direction DR2. In other words, the main plate MP may have a generally flat shape when viewed from the top. The main plate MP may be disposed to have the same width in the third direction DR3 along the profile of the first active area AA_1 of the display panel PNL.

One surface of the main plate ML in the third direction DR3 may be the upper surface where the first active area AA_1 of the display panel PNL is attached, while the opposite surface of the main plate MPL in the third direction DR3 may be the lower surface where an air gap is formed, which will be described later.

The segments SG may support the second active area AA_2 and the third active area AA_3 of the display panel PNL. Specifically, the segments SG may support a part of the non-active area NAA surrounding the second active area AA_2 and the second active area AA_3 in addition to the second active area AA_2 and the third active area AA_3 of the display panel PNL. The segments SG may be disposed on the both sides of the main plate MP in the first direction DR1.

Each of the segments SG may be extended in the second direction DR2 and may be spaced apart from one another in the first direction DR1. Since each of the segments SG has a width in the second direction DR2 that is greater than the width of the display panel PNL in the second direction DR2, the segments SG may protrude from the display panel PNL in the second direction DR2. In other words, each of the segments SG may include a protruding area PTA not covered by the display panel PNL as shown in FIGS. 3 and 4. The protruding areas PTA of the segments SG may be engaged with guide rails formed in the panel storage SD.

The width of each of the segments SG in the third direction DR3 may be larger than the thickness of the main plate MP. Accordingly, an air gap may be formed under the main plate MP as shown in FIG. 5. As the air gap is formed under the main plate MP, a shock applied to the display panel PNL can be mitigated. For example, the air gap may absorb a shock in a case that an object such as a user's pen drops onto the first active area AA_1 of the display panel PNL.

The first sub-plate SP_1 may support a part of the non-active area NAA disposed at one end of the second active area AA_2 in the first direction DR1. The second sub-plate SP_2 may support a part of the non-active area NAA disposed at the opposite end of the third active area AA_3 in the first direction DR1. Each of the first sub-plate SP_1 and the second sub-plate SP_2 may have a shape generally extended in the second direction DR2, and may have a width that is greater than the width of each of the segment bodies SG in the first direction DR1.

Since each of the first sub-plate SP_1 and the second sub-plate SP_2 has a width in the second direction DR2 that is greater than the width of the display panel PNL in the second direction DR2, it may protrude from the display panel PNL in the second direction DR2. In other words, each of the first sub-plate SP_1 and the second sub-plate SP_2 may include a protruding area PTA not covered by the display panel PNL. The protruding areas PTA of the first sub-plate SP_1 and the second sub-plate SP_2 may be engaged with the guide rails formed in the panel storage SD.

The main plate MPL, the first sub-plate SP_1 and the second sub-plate SP_2 and the segments SG may have substantially the same relative positional relationship with respect to the display panel PNL. That is to say, in a case that the display panel PNL is flat without bending, at least one plane parallel to the display panel PNL may pass through the main plate MPL, the first sub-plate SP_1, the second sub-plate SP_2 and the segments SG.

As shown in FIGS. 1A and 1B, the panel storage SD may accommodate at least a part of the display panel PNL, and may assist the sliding motion of the display device 1. The panel storage SD may include a first storage SD_1 located at the center of the display device 1, a second storage SD_2 disposed on the one side of the first storage SD_1 in the first direction DR1 and comprising the first rounded area RA_1, and a third storage SD_3 disposed on the opposite side of the first storage SD_1 in the first direction DR1 and comprising the second rounded area RA_2. The first storage SD_1 may connect the second storage SD_2 with the third storage SD_3. Specifically, the first storage SD_1 may include a first sidewall storage SD_1 a connecting the opposite side of the second storage SD_2 in the second direction DR2 with the opposite side of the third storage SD_3 in the second direction DR2; and a second sidewall SD_1b connecting the one side of the second storage SD_2 in the second direction DR2 with the one side of the third storage SD_3 in the second direction DR2.

First guide rails GR1 may be formed inside the second storage SD_2 and second guide rails GR2 may be formed inside the third storage SD_3 and further configured to guide the slide motion of the display module DM.

Incidentally, a display device 1 according to an embodiment is a single slidable display device that slides in only one direction as shown in FIGS. 2A and 2B, the second-round area RA_2 and the third storage SD_3 shown in FIGS. 1A and 1B may be eliminated.

Hereinafter, it will be described that the second storage SD_2 and the third storage SD_3 of the panel storage SD configured to guide the sliding motion of the display module DM.

Figure 6A:
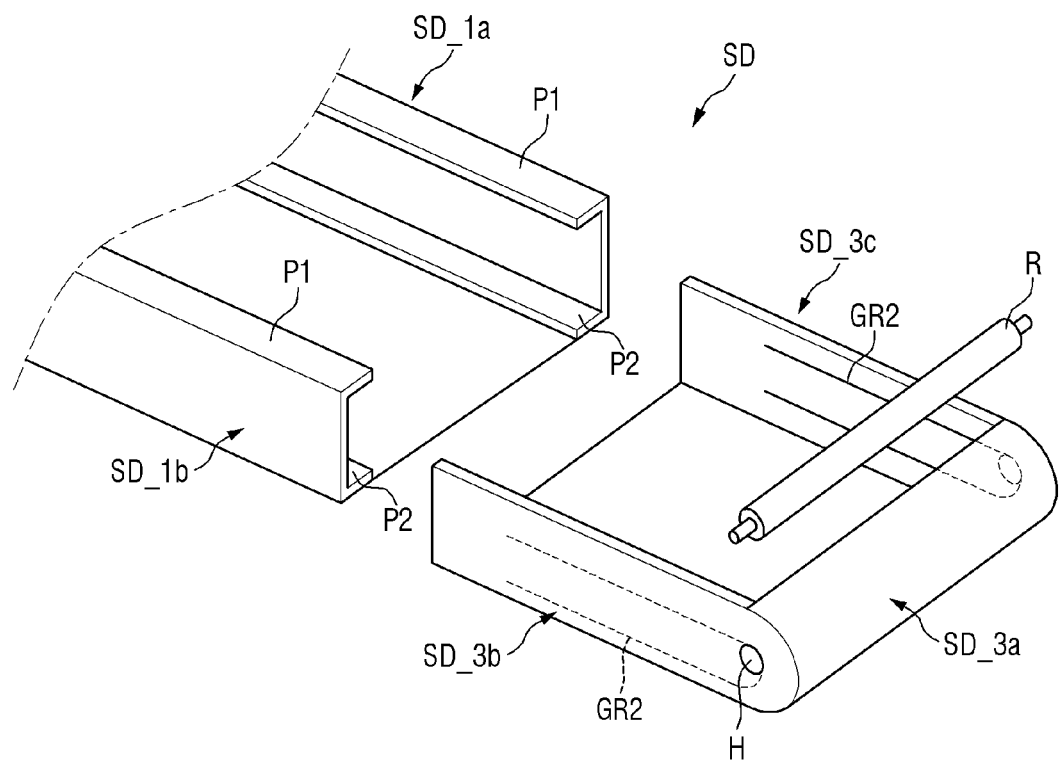
FIG. 6A is an exploded, perspective view of a panel storage of a display device according to an embodiment of the disclosure.
Figure 6B:
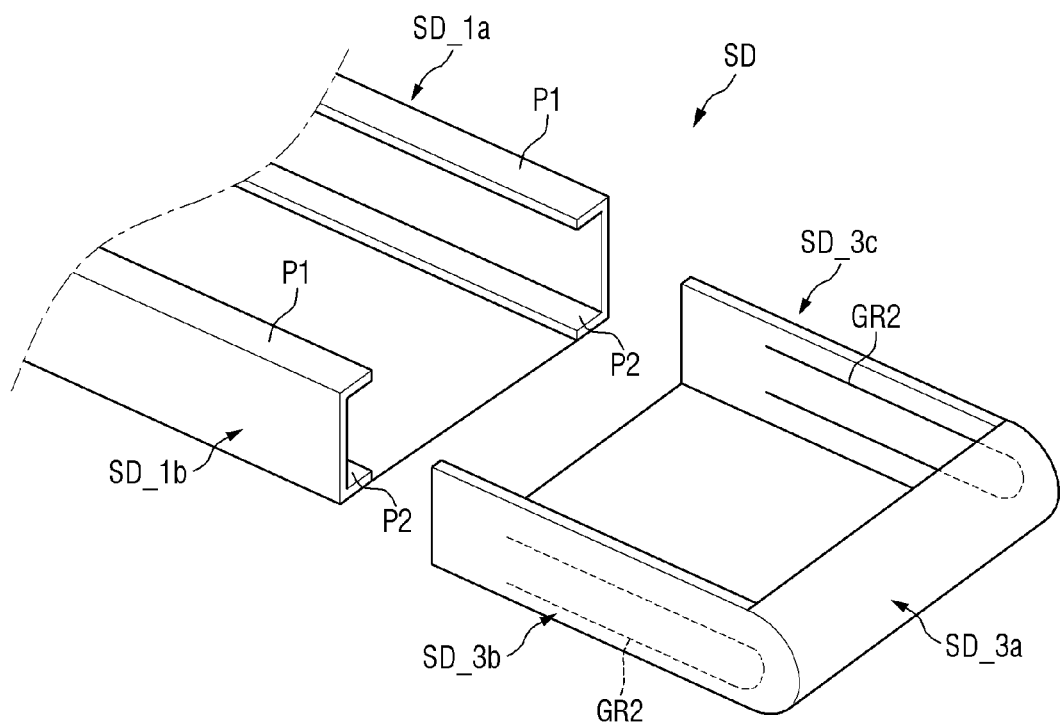
FIG. 6B is an exploded, perspective view of a panel storage of a display device according to an embodiment of the disclosure.
Figure 7:
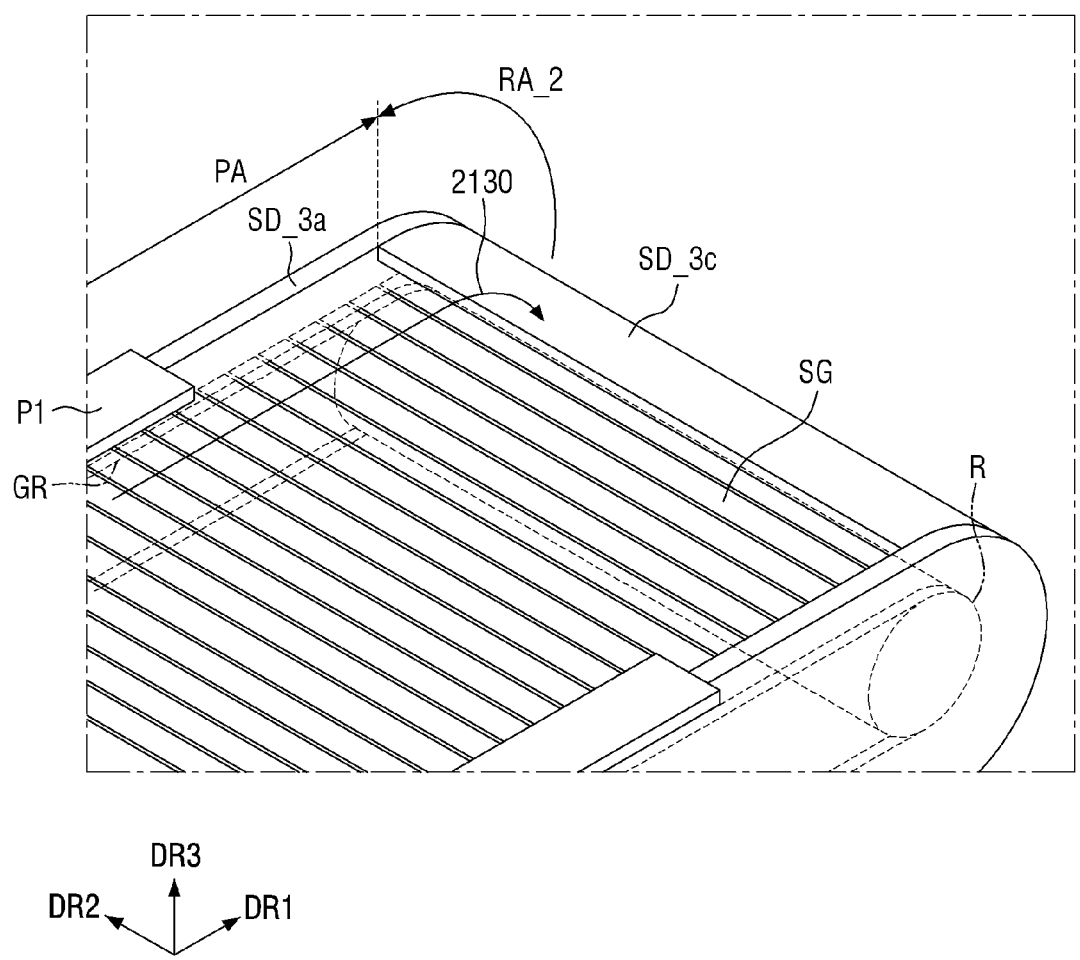
FIG. 7 is a perspective view showing the structure in which the panel storage according to the embodiment of FIG. 6A is coupled with the display module.

FIG. 6A is an exploded, perspective view of a panel storage of a display device according to an embodiment of the disclosure. FIG. 6B is an exploded, perspective view of a panel storage of a display device according to an embodiment of the disclosure. FIG. 7 is a perspective view showing the structure in which the panel storage according to the embodiment of FIG. 6A is coupled with the display module.

Referring to FIGS. 6A, 6B, and 7 in conjunction with FIGS. 1A and 1B, the panel storage SD may accommodate the display panel PNL and at least a part of the panel support SM, and may guide the sliding motion of the display device 1. The panel storage SD may include a first storage SD_1 located at the center of the display device 1, a second storage SD_2 disposed on the one side of the first storage SD_1 in the first direction DR1 and bending the second active area AA_2 of the display panel PNL, and a third storage SD_3 disposed on the opposite side of the first storage SD_1 in the first direction DR1 and bending the active area AA_3 of the display panel PNL. The first storage SD_1 may connect the second storage SD_2 with the third storage SD_3. Rails are formed inside the second storage SD_2 and the third storage SD_3 to guide the sliding motions of the display panel PNL.

Specifically, referring to FIG. 6A, the first storage SD_1 may include a first sidewall SD_1a on one side in the second direction DR2 and a second sidewall SD_1b on the opposite side in the second direction DR2. A part of the display panel PNL may be exposed between the first sidewall SD_1a and the second sidewall SD_1b. At the both ends of each of the first sidewall SD_1a and the second sidewall SD_1b in the third direction DR3, fixing portions protruding in the second direction DR2, i.e., toward the inside of the first storage SD_1, may be formed. In other words, a first fixing portion P1 may be formed at one end of each of the first sidewall SD_1a and the second sidewall SD_1b in the third direction DR3, and a second fixing portion P2 may be formed at the opposite end of each of the first sidewall SD_1a and the second sidewall SD_1b in the third direction DR3. The first fixing portion P1 and the second fixing portion P2 may face each other in the third direction DR3. Accordingly, the third storage SD_3 may be engaged and slid in the space formed between the first fixing portion P1 and the second fixing portion P2. Since the sliding movement of the second storage SD_2 is identical to that of the third storage SD_3, the third storage SD_3 will be mainly described, and the second storage SD_2 will not be described.

The third storage SD_3 may include guide portions on the both sides in the second direction DR2. Specifically, the third storage SD_3 may include a first guide portion SD_3b on one side in the second direction DR2, and a second guide portion SD_3c on the opposite side in the second direction DR2. The guide portions SD_3b and SD_3c may have a flat plate shape having a plane defined in the first direction DR1 and the third direction DR3. The guide portions may be engaged with the first fixing portion P1 and the second fixing portion P2 formed on each of the first sidewall SD_1a and the second sidewall SD_1b of the first storage SD_1 to slide in the first direction DR1.

Second guide rails GR may be formed on the first guide portion SD_3b and the second guide portion SD_3c of the third storage SD_3, respectively, so that the protruding areas PTA of the segments SG engage with them. The second guide rails GR2 may define trajectories along which the display module DM slides. The second guide rails GR may be grooves formed in the first guide portion SD_3b and the second guide portion SD_3c of the first guide portion SD_3b, respectively, so that the protruding area PTA of each of the segments SG engages with them, as shown in FIG. 7. The second guide rails GR2 may generally have a U-shape that is rotated by 90° counterclockwise. In other words, the second guide rails GR2 may have a substantially convex shape toward the side of the third storage SD_3, i.e., toward the opposite side in the first direction DR1. In other words, the guide rails GR may have a shape that is extended in the first direction DR1, is bent toward the opposite side in the third direction DR3 where the display module DM is bent, and then is extended in the first direction DR1 again. The second guide rails GR2 may be bent with different curvatures.

Holes H for disposing rollers R, which will be described later, may be formed at locations of the guide portions at which the second guide rails GR2 are bent. The second guide rails GR2 may have a shape surrounding the hole H.

The third storage SD_3 may include a cover portion SD_3a connecting the first guide portion SD_3b with the second guide portion SD_3c. The cover portion SD_3a can prevent the bent portion of the display module DM from being seen from the outside.

The panel storage SD may further include rollers R. The rollers R may assist the sliding behavior of the display panel PNL. The rollers R may be in a cylindrical shape having a circular cross-section. The rollers R may be inserted and fixed in the holes H formed in the guide portions. It should be understood, however, that the disclosure is not limited thereto. The rollers R and the holes H shown in FIG. 6A may be eliminated as shown in FIG. 6B.

Figure 8:
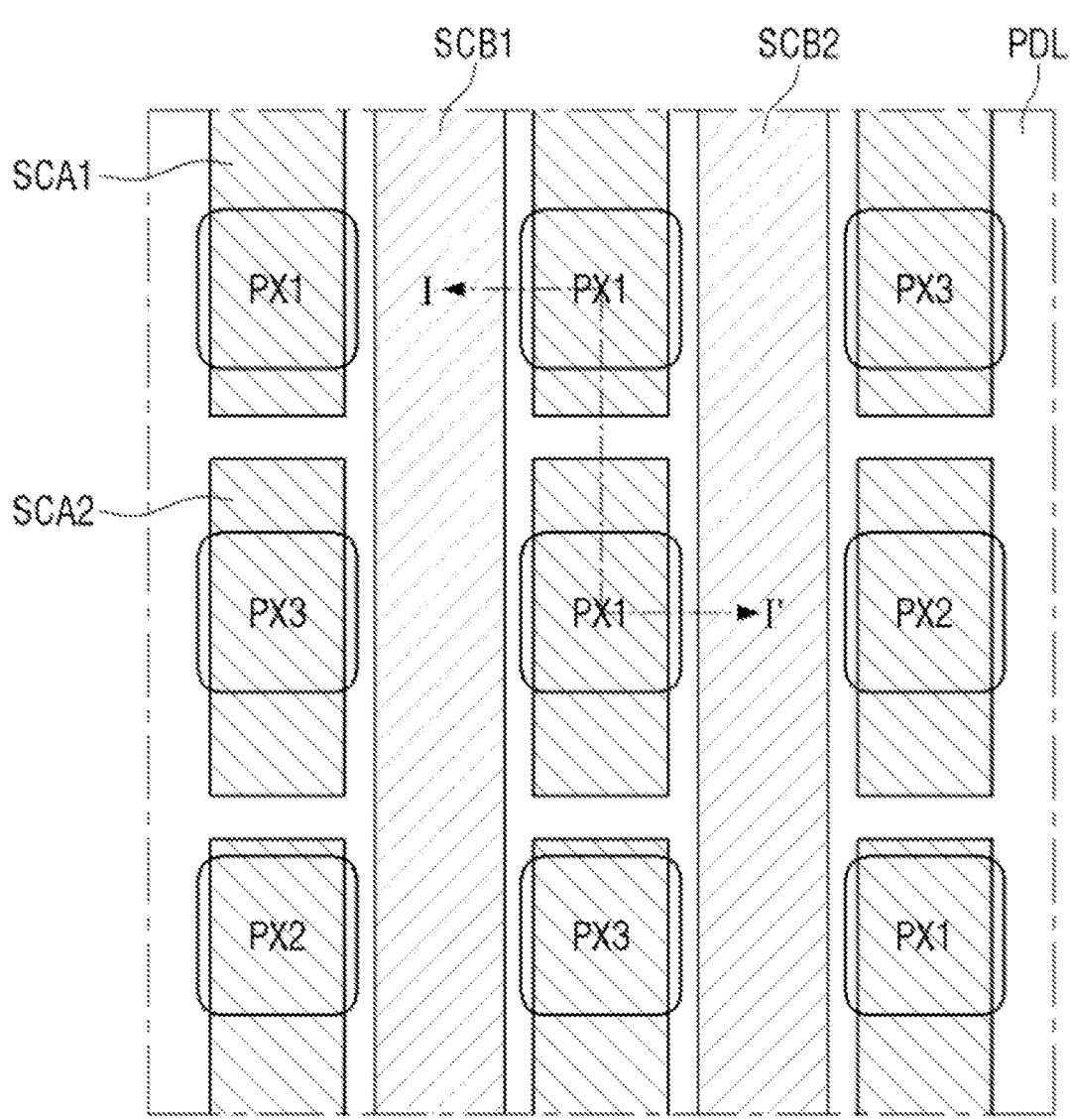
FIG. 8 is a view showing a layout of pixels and light-absorbing layers of a display device according to an embodiment.
Figure 9:
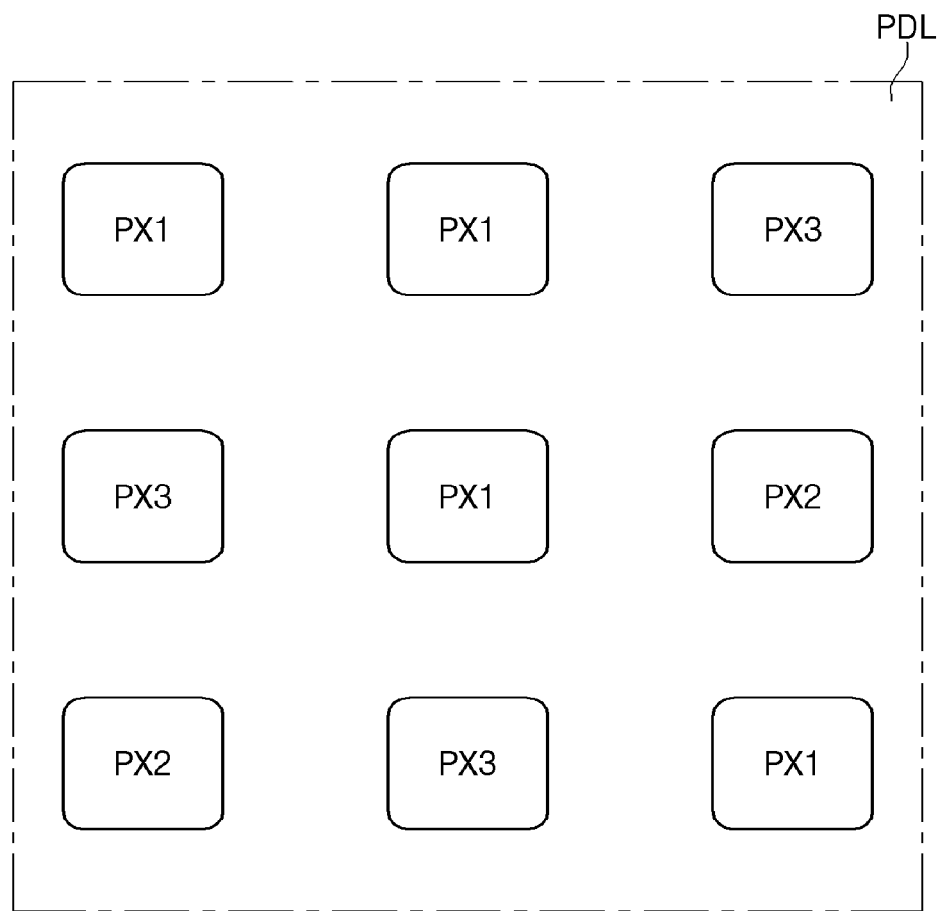
FIG. 9 is a view showing the layout of the pixels of FIG. 8.
Figure 9:
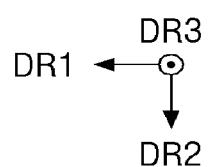
Figure 10:
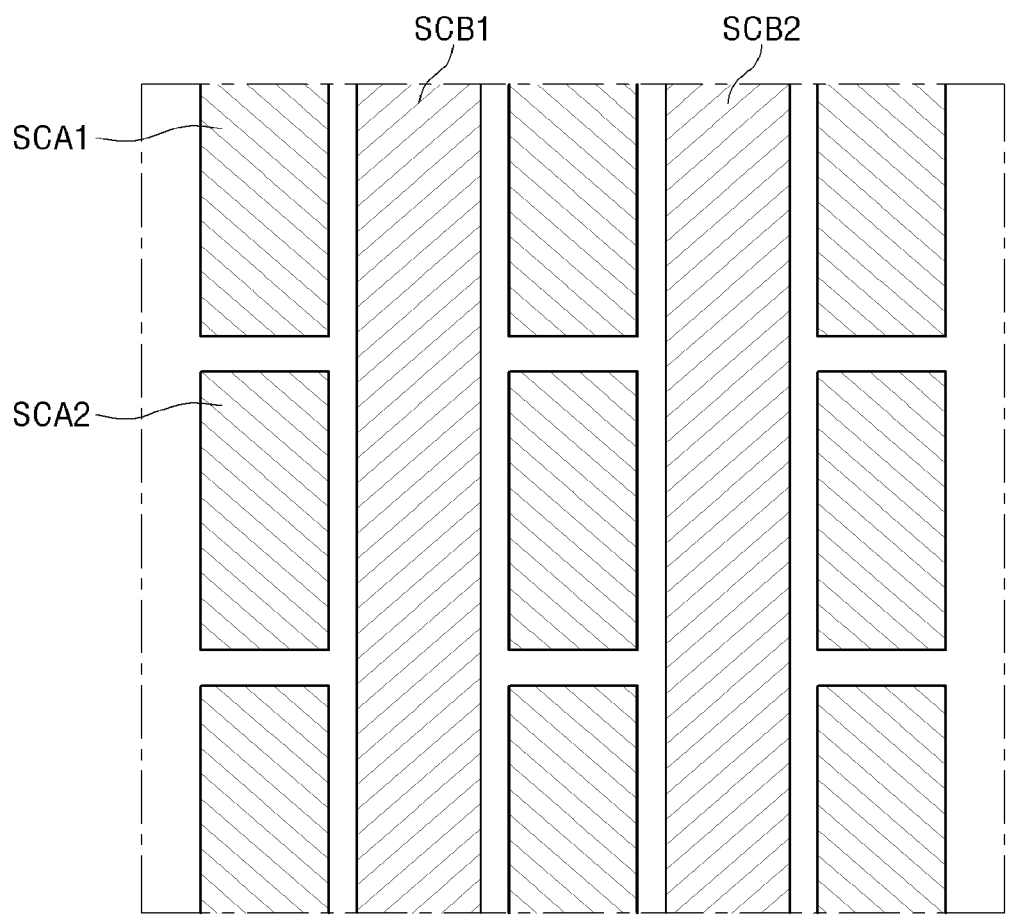
FIG. 10 is a view showing the layout of the light-absorbing layers of FIG. 8.
Figure 10:
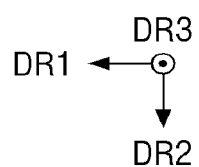

FIG. 8 is a view showing a layout of pixels and light-absorbing layers of a display device according to an embodiment. FIG. 9 is a view showing the layout of the pixels of FIG. 8. FIG. 10 is a view showing the layout of the light-absorbing layers of FIG. 8.

Referring to FIGS. 8 to 10, a display panel PNL (e.g., a first display unit AA_1_, a second display unit AA_2_, and a third display unit AA_3_) of a display device according to an embodiment includes first pixels PX1, second pixels PX2 and third pixels PX3. The first pixels PX1, the second pixels PX2 and the third pixels PX3 may display different colors.

The first pixels PX1, the second pixels PX2 and the third pixels PX3 may be spaced apart from one another in the first direction DR1 and in the second direction DR2 crossing the first direction DR1, and may be arranged in a matrix. The third pixel PX3, the second pixel PX2 and the first pixel PX1 are arranged in this order in the first direction DR1 to form a first row. The second pixel PX2, the first pixel PX1 and the third pixel PX3 are arranged in this order in the first direction DR1 to form a second row. The first pixel PX1, the third pixel PX3 and the second pixel PX2 are arranged in this order to form a third row.

Similarly, the first pixel PX1, the third pixel PX3 and the second pixel PX2 are arranged in this order in the second direction DR2 to form a first column. The second pixel PX2, the first pixel PX1 and the third pixel PX3 are arranged in this order in the second direction DR2 to form a second column. The third pixel PX3, the second pixel PX2 and the first pixel PX1 are arranged in this order to form a third column.

It is to be understood that the arrangement of the first pixels PX1, the second pixels PX2 and the third pixels PX3 is not limited thereto, and a variety of arrangements may be applied.

Although not shown in the drawings, according to another embodiment, a display device may further include pixels for representing a different color in addition to the first pixels PX1, the second pixels PX2 and the third pixels PX3.

The areas of the first pixels PX1, the second pixels PX2 and the third pixels PX3 are in line with the open areas of a pixel-defining layer PDL. This will be described in more detail later.

A display panel PNL (e.g., a first display unit AA_1, a second display unit AA_2, and a third display unit AA_3) of a display device according to an embodiment includes light-absorbing layers SCA and SCB. The light-absorbing layers SCA and SCB include first light-absorbing layers SCA and second light-absorbing layers SCB. The first light-absorbing layers SCA include (1-1) light-absorbing layers SCA1 and (1-2) light-absorbing layers SCA2, and the second light-absorbing layers SCB include (2-1) light-absorbing layers SCB1 and (2-2) light-absorbing layers SCB2.

The light-absorbing layers SCA and SCB may have a periodic shape. Specifically, the shape may be a set of different rectangles as shown in the plan view of FIG. 8, but the disclosure is not limited thereto. For example, the light-absorbing layers SCA and SCB may have a rectangular shape of the same size, or may have shapes such as a triangle and a pentagon. In the following description, it is assumed that the light-absorbing layers SCA and SCB have the shapes shown in FIG. 8.

The first light-absorbing layers SCA may be arranged in the second direction DR2. The (1-2) light-absorbing layer SCA2 may be disposed on the side of the (1-1) light-absorbing layer SCA1 in the second direction DR2, and the (1-1) light-absorbing layer SCA1 may be disposed on the side of the (1-2) light-absorbing layer SCA2 in the second direction DR2. The second light-absorbing layer SCB is disposed on the side of the first light-absorbing layer SCA in the first direction DR1. More specifically, a (2-1) light-absorbing layer SCB1 may be disposed on the opposite side of the first light-absorbing layers SCA in the first direction DR1, first light-absorbing layers SCA may be disposed again on the opposite side of the (2-1) light-absorbing layer SCB1 in the first direction DR1, and a (2-2) light-absorbing layer SCB2 may be disposed on the opposite side of the first light-absorbing layers SCA in the first direction DR1. The (2-1) light-absorbing layers SCB1 and the (2-2) light-absorbing layers SCB2 may have substantially the same structure.

Although not shown in the drawings, solar cells each include a light-absorbing layer SCA or SCB, a first electrode, and a second electrode. The second electrode connected to a (1-1) light-absorbing layer SCA1 may be connected to the first electrode connected to the adjacent (1-2) light-absorbing layer SCA2. The second electrode connected to the (1-2) light-absorbing layer SCA2 may be connected to the first electrode connected to another adjacent (1-1) light-absorbing layer SCA1. That is to say, the first light-absorbing layers SCA may be connected in series with one another.

The first electrodes connected to the first light-absorbing layers SCA may be connected to the first electrodes connected to the adjacent second light-absorbing layers SCB. The second electrodes connected to the first light-absorbing layers SCA may be connected to the second electrodes connected to the adjacent second light-absorbing layers SCB. That is to say, the first light-absorbing layers SCA and the second light-absorbing layers SCB may be connected in parallel to each other.

The connection relationships between the (1-1) light-absorbing layer SCA1, the (1-2) light-absorbing layer SCA2, the (2-1) light-absorbing layer SCB1, and the (2-2) light-absorbing layer SCB2 will be described later.

The first light-absorbing layers SCA at least partially overlap with the pixels in the third direction DR3. Referring to FIG. 8, the (1-1) light-absorbing layer SCA1 may overlap with the first pixel in the third direction DR3, and the (1-2) light-absorbing layer SCA2 may overlap with the third pixel and the third direction DR3.

The second light-absorbing layers SCB may not overlap with the pixels in the third direction DR3. In other words, the second light-absorbing layers SCB may be disposed to overlap the pixel-defining layer PDL in the third direction DR3. Accordingly, the pixels and the second light-absorbing layers SCB may be spaced apart from each other.

Figure 11:
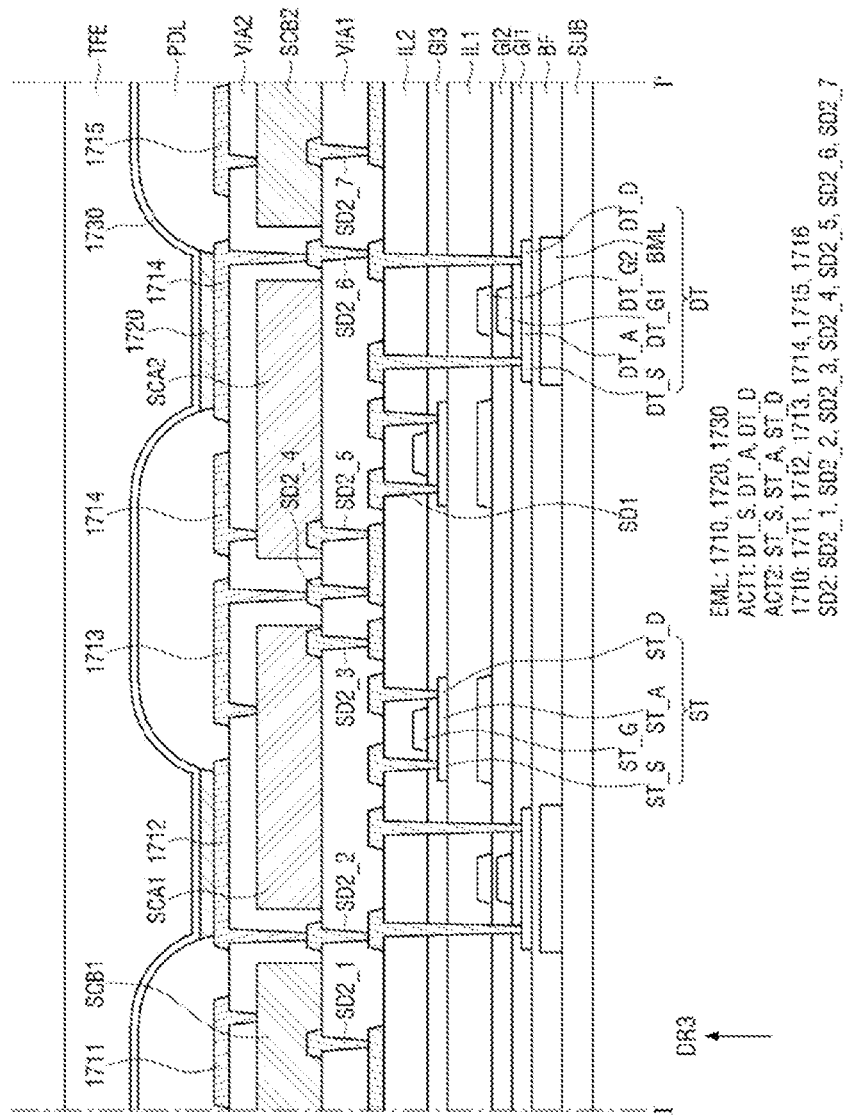
FIG. 11 is a cross-sectional view taken along line I-I' of FIG. 8.
Figure 12:
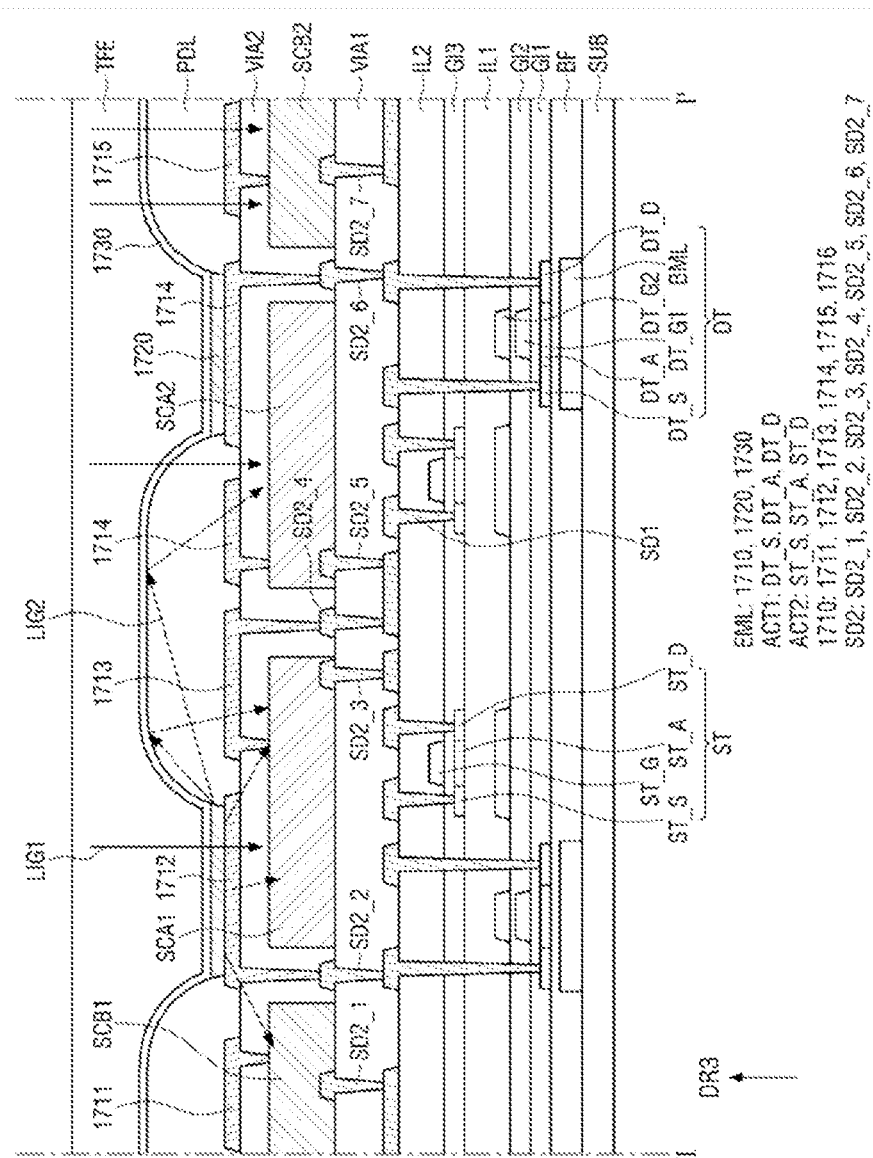
FIG. 12 is a view showing light absorption in FIG. 11.

FIG. 11 is a cross-sectional view taken along line I-I' of FIG. 8. FIG. 12 is a view showing light absorption in FIG. 11.

Referring to FIGS. 11 and 12, the first display unit AA_1, the second display unit AA_2, and the third display unit AA_3 of the display panel PNL each may include a substrate SUB, a light-blocking layer BML, a buffer layer BF, a first semiconductor layer ACT1, a first gate insulator GI1, a first gate layer DT_G1, a second gate insulator GI2, a second gate layer DT_G2, a first interlayer dielectric layer IL1, a second semiconductor layer ACT2, a third gate insulator GI3, a third gate layer GTL3, a second interlayer dielectric layer IL2, a first connection electrode SD1, a first planarization layer VIA1, a second connection electrode SD2, light-absorbing layers SCA and SCB, a second planarization layer VIA2, an light-emitting element EML, a pixel-defining layer PDL, and an encapsulation layer TFE.

The substrate SUB may be a base substrate and may be made of an insulating material such as a polymer resin. For example, the substrate SUB may be a flexible substrate that can be bent, folded, or rolled.

The light-blocking layer BML and the buffer layer BF may be formed on a surface of the substrate SUB. The light-blocking layer BML may be disposed to overlap a driving channel of the first semiconductor layer ACT1. It is possible to prevent light incident from the substrate SUB from being incident on the driving channel by virtue of the light-blocking layer BML.

The buffer layer BF may be formed on one surface of the substrate SUB in order to protect the thin-film transistors and emissive layers 1720 of the light-emitting elements EML from moisture that is likely to permeate through the substrate SUB.

The first semiconductor layer ACT1 may be disposed on the substrate SUB or the buffer layer BF. The first semiconductor layer ACT1 may be made of a silicon-based material. For example, the first active layer ACT1 may be made of low-temperature polycrystalline silicon (LTPS). The first semiconductor layer ACT1 may include a driving channel DT_A, a source electrode DT_S and a drain electrode DT_D of the driving transistor DT. The light-blocking layer BML may be formed under the first semiconductor layer ACT1 in order to block external light incident on the first semiconductor layer ACT1.

The first gate insulator GI1 may cover the buffer layer BF and the first semiconductor layer ACT1, and may insulate the first semiconductor layer ACT1 from the first gate layer DT_G1.

The first gate layer DT_G1 may be disposed on the first gate insulator GI1. The first gate layer DT_G1 may include a gate electrode of the driving transistor DT. The first gate layer DT_G1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second gate insulator GI2 may cover the first gate layer DT_G1 and the first gate insulator GI1. The second gate insulator GI2 may insulate the first gate layer DT_G1 from the second gate layer DT_G2.

The second gate layer DT_G2 may be disposed on the second gate insulator GI2. The second gate layer DT_G2 may include the same material as the above-described first gate layer DT_G1.

The first interlayer dielectric film IL1 may cover the second gate layer DT_G2 and the second gate insulator GI2. The first interlayer dielectric film IL1 may insulate the second gate layer DT_G2 from the second semiconductor layer ACT2.

The second semiconductor layer ACT2 may be disposed on the first interlayer dielectric film ILL For example, the second semiconductor layer ACT2 may be formed of an oxide-based material. The second semiconductor layer ACT2 may include a switching channel ST_A, a source electrode ST_S, and a drain electrode ST_D of the switching transistor ST.

The third gate insulator GI3 may cover the first interlayer dielectric film ILD1 and the second semiconductor layer ACTL2 and may insulate the second semiconductor layer ACT2 from the third gate layer GTL3.

The third gate layer GTL3 may be disposed on the third gate insulator GI3. The third gate layer GTL3 may include the same material as the above-described first gate layer DT_G1.

The second interlayer dielectric film IL2 may cover the third gate layer GTL3 and the third gate insulator GI3. The second interlayer dielectric film IL2 may insulate the third gate layer GTL3 from the first connection electrode SD1.

The first connection electrode SD1 may be disposed on the second interlayer dielectric film IL2. The first connection electrode SD1 may be connected to the source electrode of the driving transistor, the drain electrode of the driving transistor, and the source electrode and the drain electrode of the switching transistor through contact holes.

The first connection electrode SD1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first planarization layer VIA1 may cover the first connection electrode SD1 and the second interlayer dielectric film IL2. The first planarization layer VIA1 may provide a flat surface over the first semiconductor layer ACT1, the first gate layer DT_G1, the second gate layer DT_G2, the third gate layer GTL3 and the first connection electrode SD1 having different heights. The first planarization layer VIA1 may be formed as an organic layer such as an acryl resin, an epoxy resin, a phenolic resin, a polyamide resin and a polyimide resin.

The second connection electrode SD2 may be disposed on the first planarization layer VIAL The second connection electrode SD2 may be connected to the first connection electrode SD1 through a contact hole. The second connection electrode SD2 also is configured to electrically connect a surface of the first planarization layer VIA1 with an opposite surface of the first planarization layer VIA1 through a first contact hole. The second connection electrode SD2 may include the same material as the first data conductive layer DTL1 described above.

The light-absorbing layers SCA and SCB may be disposed on the first planarization layer VIA1 and the second connection electrode SD2. For example, light-absorbing layers SCA and SCB may be disposed on a surface of the first planarization layer VIA1. The light-absorbing layers SCA and SCB will be described later.

The second planarization layer VIA2 may cover the second connection electrode SD2, the first planarization layer VIA1, and the light-absorbing layers SCA and SCB. The second planarization layer VIA2 may provide a flat surface over the second connection electrode SD2 and the light-absorbing layers SCA and SCB having different heights. The second planarization layer VIA2 may include the same material as the first planarization layer VIA1 described above.

The light-emitting element EML and the pixel-defining layer PDL are disposed on the second planarization layer VIA2. For example, the pixel-defining layer PDL may be disposed on a surface of the second planarization layer VIA2 and covering the second planarization layer VIA2. The pixel-defining layer PDL also may be not overlapping with the emissive layer 1720 in the thickness direction DR3. The light-emitting element EML and the pixel-defining layer PDL are formed on the second planarization layer VIA2. Each light-emitting element EML may include a pixel electrode 1710, an emissive layer 1720, and a common electrode 1730.

The pixel electrode 1710 may be formed on the second planarization layer VIA2. The pixel electrode 1710 may be disposed in each pixel PX. Specifically, the pixel electrode 1710 is disposed at the lower portion of each pixel PX, and the pixel PX may be disposed on a part of the pixel electrode 1710. The pixel electrode 1710 may be connected to the second connection electrode SD2 through a contact hole.

The pixel electrode 1710 may have, but is not limited to, a single-layer structure of molybdenum (Mo), titanium (Ti), copper (Cu) or aluminum (Al), or may have stack of multiple films, e.g., a multi-layer structure of ITO/Mg, ITO/MgF, ITO/Ag and ITO/Ag/ITO including indium-tinoxide (ITO), indium-zinc-oxide (IZO), zinc oxide (ZnO), indium oxide (In$_2$O$_3$), and silver (Ag), magnesium (Mg), aluminum (Al), platinum (Pt), lead (Pb), gold (Au) and nickel (Ni).

The pixel-defining layer PDL may be formed on the pixel electrodes 1710 to define the emission area EA of each of the pixels PX. The pixel-defining layer PDL may be formed to cover the edges of the pixel electrodes 1710. The pixel-defining layer PDL may be formed of an organic layer such as an acryl resin, an epoxy resin, a phenolic resin, a polyamide resin and a polyimide resin.

In the emission area EA of each of the pixels PX, the pixel electrode 1710, the emissive layer 1720 and the common electrode 1730 are stacked on one another sequentially, so that holes from the pixel electrode 1710 and electrons from the common electrode 1730 are combined with each other in the emissive layer 1720 to emit light.

The emissive layer 1720 is formed on the pixel electrode 1710 and the pixel-defining layer PDL. For example, the emissive layer 1720 may be formed on a surface of the pixel electrode 1710. The emissive layer 1720 may include an organic material to emit light of a certain color. For example, the emissive layer 1720 may include a hole transporting layer, an organic material layer, and an electron transporting layer. Each of the pixels PX may emit one of light of a first color, light of a second color, and light of a third color.

The common electrode 1730 is formed on the emissive layer 1720 and the pixel-defining layer PDL. The common electrode 1730 may be disposed across the pixels PX to cover the pixel-defining layer PDL and the emissive layer 1720. The common electrode 1730 may include, a conductive material having a low work function, for example, Li, Ca, LiF/Ca, LiF/Al, Al, Mg, Ag, Pt, Pd, Ni, Au, Nd, Jr, Cr, BaF, Ba, or a compound or mixture thereof, (e.g., a mixture of Ag and Mg). Alternatively, the common electrode 590 may include a transparent metal oxide, for example, indium-tin-oxide (ITO), indium-zinc-oxide (IZO), zinc oxide (ZnO), etc.

The encapsulation layer TFE may be disposed on the light-emitting element EML and the pixel-defining layer PDL. The encapsulation layer TFE may include at least one inorganic film to prevent permeation of oxygen or moisture into the emissive layer 1720. In addition, the encapsulation layer TFE may include at least one organic film to protect the emissive layer 1720 from particles such as dust. For example, the encapsulation layer TFE may be formed in a structure in which a first inorganic film, an organic film, and a second inorganic film are sequentially stacked on one another. The first inorganic film and the second inorganic film may be made up of multiple films in which one or more inorganic films of a silicon nitride layer, a silicon oxynitride layer, a silicon oxide layer, a titanium oxide layer and an aluminum oxide layer are alternately stacked on one another. The organic film may be an acryl resin, an epoxy resin, a phenolic resin, a polyamide resin or a polyimide resin.

Solar cells of a display device according to an embodiment include light-absorbing layers SCA and SCB, second connection electrodes SD2, and pixel electrodes 1710. Specifically, the second connection electrodes SD2 are the first electrodes of the solar cells, and the pixel electrodes 1710 are the second electrodes of the solar cells. In other words, the second connection electrodes SD2 may be in direct contact with one or more first surfaces of the light-absorbing layers SCA and SCB. The second connection electrodes SD2 also may connect the first connection electrodes SD1 with the top of the first planarization layer VIA1 through contact holes, and may also be configured to operate as the electrodes of the solar cells. The pixel electrodes 1710 may be in direct contact with one or more second surfaces of the light-absorbing layers SCA and SCB, the one or more second surfaces opposite the one or more first surfaces. The pixel electrodes 1710 also may be configured to operate as the electrodes of the light-emitting elements EML and also as the electrodes of the solar cells. That is to say, the first electrodes of the solar cells refer to the second connection electrodes SD2, and the second electrodes of the solar cells refer to the pixel electrodes 1710. The light-absorbing layers SCA and SCB are disposed between the second connection electrodes SD2 and the pixel electrodes 1710.

The upper surfaces of the light-absorbing layers SCA and SCB may be in direct contact with the pixel electrodes 1710, and the lower surfaces of the light-absorbing layers SCA and SCB may be in direct contact with the connection electrodes.

The pixel electrodes 1710 may be cathode electrodes of the solar cells that collect electrons, and the second connection electrodes SD2 may be anode electrodes of the solar cells that collect holes. The second connection electrodes SD2 may be formed of a conductive material having a higher work function than that of the pixel electrodes 1710, and may be formed of a metal film having a thickness thin enough to transmit light. For example, the second connection electrodes SD2 may be made up of a double layer of zinc sulfide (ZnS)/silver (Ag). It is to be understood that the pixel electrode 1710 and the second connection electrode SD2 may be interchangeable. That is to say, the pixel electrodes 1710 may be the anode electrodes of the solar cells and the second connection electrodes may be the cathode electrodes of the solar cells.

The first light-absorbing layers SCA may at least partially overlap with the emissive layers 1720 in the third direction DR3. That is to say, a part of the first light-absorbing layers SCA may overlap with the emissive layers 1720, and the other part thereof may overlap the pixel-defining layer PDL in the thickness direction DR3. Since the first light-absorbing layers SCA are disposed under the emissive layers 1720, lights emitted from the emissive layers 1720 toward the opposite side in the third direction DR3 may be absorbed by the first light-absorbing layers SCA.

The second light-absorbing layers SCB may not overlap with the emissive layers 1720 in the third direction DR3. In other words, the second light-absorbing layers SCB may overlap the pixel-defining layer PDL.

The pixel electrodes 1710 may be disposed between the light-absorbing layers SCA and SCB. The pixel electrodes 1710 penetrate through the second planarization layer VIA2 through contact holes formed in the second planarization layer VIA2. Accordingly, a part of the pixel electrodes 1710 penetrating through the second planarization layer VIA2 may be disposed between the light-absorbing layers SCA and SCB, for example the pixel electrodes 1710 may be disposed between a side surface of the first light-absorbing layer SCA and a side surface of the second light-absorbing layer SCB. That is to say, the pixel electrodes 1710 may be disposed between the (1-1) light-absorbing layer SCA1, the (1-2) light-absorbing layer SCA2, the (2-1) light-absorbing layer SCB1 and the (2-2) light-absorbing layer SCB2.

The pixel electrodes 1710 penetrating between the side surfaces of the light-absorbing layers SCA and SCB and the planarization layer may be spaced apart from one another. That is to say, the second planarization layer VIA2 may be disposed between the pixel electrodes 1710 and the light-absorbing layers SCA and SCB, and the second planarization layer may cover the side surfaces of the light-absorbing layers SCA and SCB.

The light-absorbing layers SCA and SCB are disposed under the light-emitting elements EML. Accordingly, the distance from the substrate SUB to the light-absorbing layers SCA and SCB may be smaller than the distance from the substrate SUB to the emissive layers 1720. That is to say, the light-absorbing layers SCA and SCB may be disposed closer to the substrate SUB than the emissive layers 1720.

Since the light-absorbing layers SCA and SCB that absorb light are disposed under the light-emitting elements EML, the light-absorbing layers SCA and SCB do not absorb lights emitted from the emissive layers 1720 toward the one side in the third direction DR3. Accordingly, the light-absorbing layers SCA and SCB may overlap with the light-emitting elements EML. Accordingly, the location of the light-absorbing layers SCA and SCB may be less restricted.

In some embodiments, the light-absorbing layers SCA and SCB may cover 80% or more of one surface of the first planarization layer VIA1. For example, the light-absorbing layers SCA and SCB may be disposed entirely except for the regions where the pixel electrodes 1710 penetrate through the second planarization layer VIA2, and may cover 95% of the surface of the first planarization layer VIA1. As such, the light-absorbing layers SCA and SCB are disposed in a wide area, so that the power consumption of the display device can be improved.

The light-absorbing layers SCA and SCB may be disposed in all of the first display area DA_1, the second display area DA_2 and the third display area DA_3 of the display panel PNL of the display device according to the embodiment. The light-absorbing layers SCA and SCB disposed in the first display area DA_1, the second display area DA_2 and the third display area DA_3 of the display panel PNL may have substantially the same structure. The light-absorbing layers SCA and SCB within the second display unit AA_2 (identified by the second display area DA_2) and the third display unit AA_3 (identified by the third display area DA_3) also can be referred to herein as auxiliary light-absorbing layers.

In some embodiments, the first display area DA_1 of the display panel PNL may have a flat shape, and the second display area and the third display area may have a curvature. In case that the display panel PNL has a curvature, the display panel PNL may be bent and distances between different elements of the display panel PNL may increase. That is to say, the distance between the light-absorbing layers SCA and SCB disposed in the first display area may be smaller than the distance between the light-absorbing layers SCA and SCB disposed in the second display area and the third display area.

The light-absorbing layers SCA and SCB may be made up of a double-layer structure (D/A bi-layer) or a composite structure ((D+A) blend) of a donor (electron donor, D) material and an acceptor (electron acceptor, A) material. The light-absorbing layers SCA and SCB may be made up of a structure in which a complex structure ((D+A) blend) is stacked between a donor layer and an acceptor layer.

An n-buffer layer (not shown) and/or a p-buffer layer (not shown) may be further disposed between the light-absorbing layers SCA and SCB and the second connection electrodes SD2 and between the light-absorbing layers SCA and SCB and the pixel electrodes 1710.

The n-buffer layer may be configured to operate as an electron transport layer, and the p-buffer layer may be configured to operate as a hole transport layer, to increase the photoelectric efficiency of the solar cells.

As a donor material of the light-absorbing layers SCA and SCB, poly(para-phenylene vinylene) (PPV) based materials; derivatives of polythiophene (PT); polyfluorene (PF) based materials and copolymers thereof; or soluble polythiophene (P3HT), which is a crystalline polymer, etc. may be used.

The donor material is required to have a light absorption wavelength range that fits well with the solar spectrum, and to have high light absorption and charge mobility. As the acceptor material of the light-absorbing layers SCA and SCB, C60 itself or C60 fullerene derivatives (PCBM) designed to dissolve C60 in an organic solvent may be used. The acceptor material is required to have higher electron affinity and charge mobility than those of donor material.

Referring to FIG. 12, external light LIG1 and internal light LIG2 may be incident on the solar cell. The external light LIG1 refers to the light introduced into the display device from the outside of the display device. The internal light LIG2 refers to the light generated by the emissive layer 1720 and directly incident on the light-absorbing layers SCA and SCB without leaking to the outside, or the light reflected by the pixel-defining layer PDL or the like inside the display panel PNL and incident on the light-absorbing layers SCA and SCB.

The light-absorbing layers SCA and SCB are configured to convert light energy of external light LIG1 incident on the display unit and internal light LIG2 emitted by the emissive layer 1720 into electrical energy. In a case that external light LIG1 or internal light LIG2 is applied to the solar cell, excitons in an excited state are generated by absorbing light from the donor material of the light-absorbing layers SCA and SCB. These excitons diffuse in random directions and are separated into electrons and holes at the interface with the acceptor material. The holes remaining in the donor layer move to the second connection electrodes SD2 by the difference in concentration of the accumulated charges and the internal electric field formed by the difference in the work function between the pixel electrodes 1710 and the second connection electrodes SD2. Electrons move to the pixel electrodes 1710 along the inside of the acceptor layer and are collected. As such, electrons move to the pixel electrodes 1710 and holes move to the second connection electrodes SD2, so that current can flow.

In this manner, it is possible to charge the display even at night with no external light or in an indoor environment in which the external light is weak by way of generating power with the internal light.

The solar cells are used to supply power to the display panel PNL. By supplying power to a display unit 100 with the solar cells, the power consumption of the display device can be improved.

Figure 13:
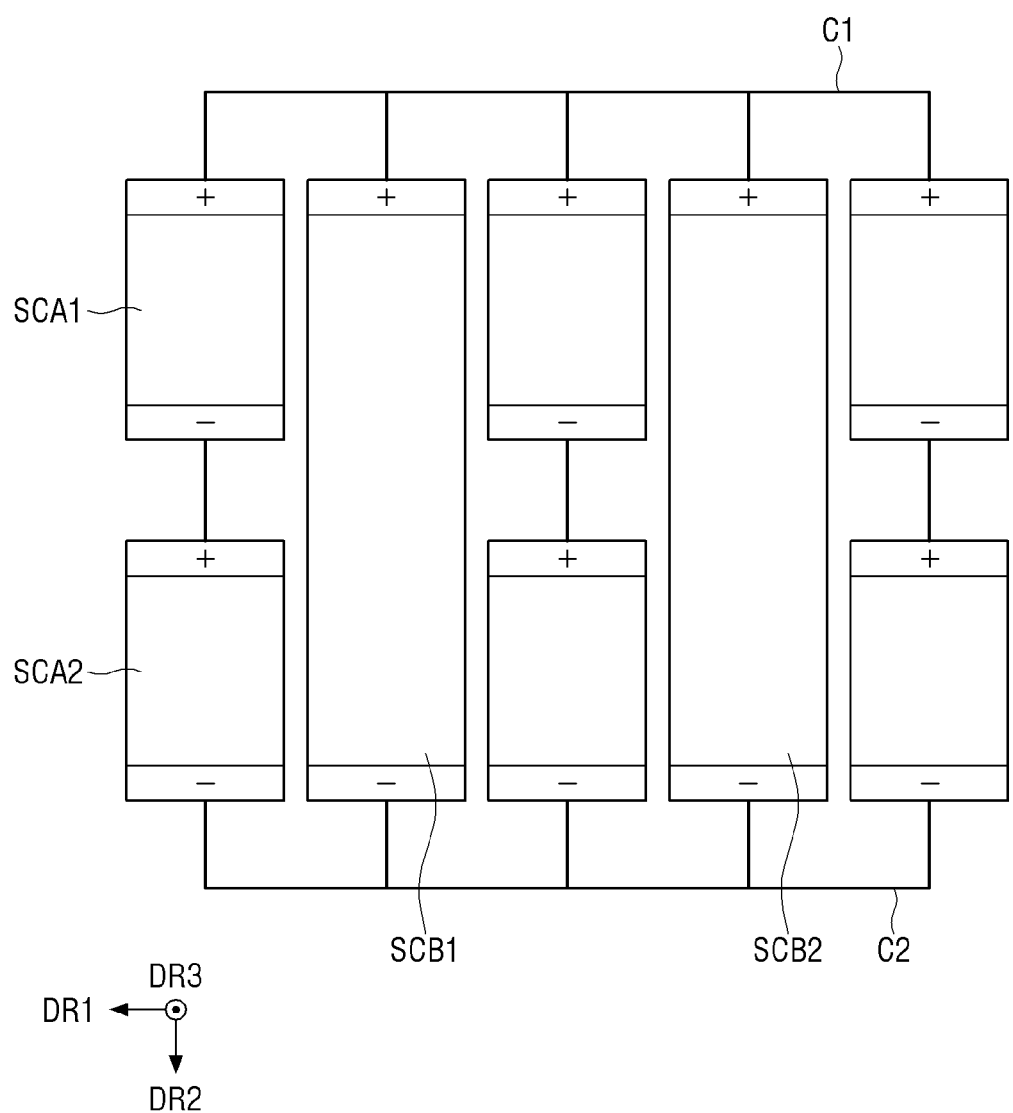
FIG. 13 is a view showing connection relationships between light-absorbing layers of a display device according to an embodiment.

FIG. 13 is a view showing the connection relationship between light-absorbing layers of a display device according to an embodiment.

Referring to FIGS. 11 and 13, the (1-1) light-absorbing layer SCA1 and the (1-2) light absorption layer SCA2 included in the first light-absorbing layers SCA may be connected in series with each other. Specifically, the second electrode of the (1-1) light-absorbing layer SCA1 is connected to the first electrode of the (1-2) light-absorbing layer SCA2.

The first light-absorbing layers SCA and the second light-absorbing layers SCB may be connected in parallel to each other. That is to say, the first electrodes of the first light-absorbing layers SCA and the first electrodes of the second light-absorbing layers SCB are connected through first connection portions C1, and the second electrodes of the first light-absorbing layers SCA and the second electrodes of the second light-absorbing layers SCA are connected through the second connection portions C2.

That is to say, the (1-1) light-absorbing layer SCA1 and the (1-2) light-absorbing layer SCA2 included in the first light-absorbing layers SCA are connected in series, while the entire first light-absorbing layers SCA connected in series may be connected in parallel to the second light-absorbing layers SCB.

Referring to FIG. 11, the second connection electrodes SD2 include a (1-1) electrode SD2_1, a (1-2) electrode SD2_2, a (1-3) electrode SD2_3, a (1-4) electrode SD2_4, a (1-5) electrode SD2_5, a (1-6) electrode SD2_6, and a (1-7) electrode SD2_7. The pixel electrodes 1710 include a (2-1) electrode 1711, a (2-2) electrode 1712, a (2-3) electrode 1713, a (2-4) electrode 1714, and a (2-5) electrode 1715.

The (1-1) electrode SD2_1 may be the first electrode of the (2-1) light-absorbing layer SCB1, and the (2-1) electrode 1711 may be the second electrode of the (2-1) light-absorbing layer SCB1. The (1-7) electrode SD2_7 may be first electrode of the (2-2) light-absorbing layer SCB2, and the (2-5) electrode 1715 may be the second electrode of the (2-2) light-absorbing layer SCB2. That is to say, the (1-1) electrode SD2_1 and the (1-7) electrode SD2_7 may be the same or may be connected to each other, and the (2-1) electrode 1711 and the (2-5) electrode 1715 may be the same or may be connected to each other.

The (1-3) electrode SD2_3 may be the first electrode of the (1-1) light-absorbing layer SCA1, and the (2-3) electrode 1713 may be the second electrode of the (1-1) light-absorbing layer SCA1. The (1-5) electrode SD2_5 may be the first electrode of the (1-2) light-absorbing layer SCA2, and the (2-4) electrode 1714 may be the second electrode of the (1-2) light-absorbing layer SCA2. The (2-3) electrode 1713 is connected to the (1-4) electrode SD2_4 through a contact hole, the (1-4) electrode SD2_4 is connected to the first connection electrode SD1 through a contact hole, and the first connection electrode SD1 is connected to the (1-5) electrode SD2_5 through a contact hole. That is to say, the (2-3) electrode 1713 which is the second electrode of the (1-1) light-absorbing layer SCA1 may be connected to the (1-5) electrode SD2_5 which is the first electrode of the (1-2) light-absorbing layer SCA2. In other words, the (1-1) light-absorbing layer SCA1 and the (1-2) light-absorbing layer SCA2 may be connected in series with each other.

When cells are connected in series, the total current value of the cells equals to the sum of the current values of the cells. When cells are connected in parallel, the total voltage of the cells equals to the sum of the voltages of the cells. When cells are connected only in series or only in parallel, one of the current and voltage values is relatively large, but the other one is relatively small.

Power (P) is proportional to current (I) and voltage (V). Therefore, in order to increase the power efficiency of the cells, the series connection as well as the parallel connection are required. The solar cells of the display device according to the embodiment of the disclosure include first solar cells connected in series, and second solar cells connected in parallel, so that it is possible to increase the power efficiency of the solar cells.

The efficiency of solar cells are determined by variables such as an open-circuit voltage (Voc), a short-circuit current (Jsc), and a fill factor (FF).

The open-circuit voltage Voc refers to a potential difference formed across a solar cell in case that light is received in the state where the circuit is open, i.e., in the state where infinite impedance is applied. Such open-circuit voltage (Voc) increases in case that solar cells are connected in parallel.

The short-circuit current (Jsc) refers to a current density in the reverse direction (negative value) that appears in case that light is received in the state where the circuit is short-circuited, i.e., in the state where there is no external resistance. Such short-circuit current (Jsc) increases in case that solar cells is connected in series.

The fill factor (FF) refers to a value indicating how close the shape of the J-V curve is to a square in case that light is applied. The efficiency of a solar cell increases with the value of the fill factor (FF). The fill factor (FF) increases only in case that both the open-circuit voltage Voc and the short-circuit current (Jsc) increase.

If solar cells overlap with the entire surface of the pixel-defining layer of the display unit as in existing display devices, the solar cells operate like they are connected in parallel. As a result, the open-circuit voltage (Voc) may be larger but the short-circuit current (Jsc) may be small. Accordingly, the fill factor FF also decreases.

In contrast, the display device according to the embodiment of the disclosure includes first light-absorbing layers SCA connected in series, and second light-absorbing layers SCB connected in parallel, so that the open-circuit voltage (Voc) as well as the short-circuit current (Jsc) can increase. Accordingly, the efficiency of the solar cells can be increased.

As described above, the display device according to the embodiment includes solar cells, and the light-absorbing layers SCA and SCB included in the solar cells are connected in series and/or in parallel. Accordingly, by supplying power to the display unit using the solar cells, the power consumption of the display device can be improved. In addition, by connecting the solar cells in series and in parallel, it is possible to increase the efficiency of the solar cells and to improve the power consumption of the display device. Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a first planarization layer disposed on a surface of a substrate;
   a second planarization layer disposed on a surface of the first planarization layer;
   a light-emitting element comprising a pixel electrode having a bottom surface disposed on and above a surface of the second planarization layer, an emissive layer disposed on a surface of the pixel electrode, and a common electrode disposed on a surface of the emissive layer;
   a connection electrode disposed on the surface of the first planarization layer and including a portion penetrating the surface of the first planarization layer and an opposite surface of the first planarization layer; and
   a light-absorbing layer disposed on the surface of the first planarization layer and covered by the second planarization layer.

2. The display device of claim 1, further comprising:
a pixel-defining layer disposed on the surface of the second planarization layer, not overlapping the emissive layer in a thickness direction and covering the second planarization layer, wherein
the light-absorbing layer at least partially overlaps the pixel-defining layer in the thickness direction, and
the connection electrode is configured to operate as a first electrode of the light-absorbing layer, and the pixel electrode is configured to operate as a second electrode of the light-absorbing layer.

3. The display device of claim 2, wherein
the light-absorbing layer comprises:
a first light-absorbing layer overlapping the emissive layer in the thickness direction; and;
a second light-absorbing layer not overlapping the emissive layer in the thickness direction,
the second light-absorbing layer comprises a (2-1) light-absorbing layer and a (2-2) light-absorbing layer disposed on a side of the (2-1) light-absorbing layer in a first direction, and
the (2-1) light-absorbing layer and the (2-2) light-absorbing layer are electrically connected in parallel.

4. The display device of claim 3, wherein the first light-absorbing layer comprises a (1-1) light-absorbing layer and a (1-2) light-absorbing layer disposed adjacent to each other in a second direction intersecting the first direction, and
the (1-1) light-absorbing layer and the (1-2) light-absorbing layer are electrically connected in series.

5. The display device of claim 4, wherein the pixel electrode is disposed between the (1-1) light-absorbing layer and the (1-2) light-absorbing layer.

6. The display device of claim 3, wherein the pixel electrode is disposed between a side surface of the first light-absorbing layer and a side surface of the second light-absorbing layer.

7. The display device of claim 6, wherein the second planarization layer covers the side surface of the first light-absorbing layer and the side surface of the second light-absorbing layer.

8. The display device of claim 6, wherein the side surface of the first light-absorbing layer is spaced apart from the pixel electrode.

9. The display device of claim 1, wherein the light-absorbing layer is in direct contact with the connection electrode.

10. The display device of claim 9, wherein the light-absorbing layer is in direct contact with the pixel electrode.

11. The display device of claim 1, wherein a distance from the substrate to the light-absorbing layer is smaller than a distance from the substrate to the emissive layer.

12. The display device of claim 2, wherein the light-absorbing layer overlaps the emissive layer at least partially in the thickness direction.

13. The display device of claim 3, wherein the light-absorbing layers cover at least eighty percent (80%) of the surface of the first planarization layer.

14. A display device comprising:
a display panel configured to slide in a first direction; and
a panel storage having a guide rail configured to guide a sliding motion of the display panel in the first direction, wherein
the display panel comprises a first display part having a flat shape, and a second display part disposed on a side of the first display part in the first direction and having a curvature, and
the first display part comprises:
a light-absorbing layer;
a connection electrode in direct contact with a surface of the light-absorbing layer; and
a pixel electrode in direct contact with an opposite surface of the light-absorbing layer.

15. The display device of claim 14, further comprising:
an emissive layer disposed on a surface of the pixel electrode, wherein
the light-absorbing layer at least partially overlaps the emissive layer in a thickness direction, and
the connection electrode is configured to operate as a first electrode of the light-absorbing layer, and the pixel electrode is configured to operate as a second electrode of the light-absorbing layer.

16. The display device of claim 15, further comprising:
a pixel-defining layer disposed on the surface of the pixel electrode and not overlapping the emissive layer in the thickness direction, wherein the light-absorbing layer at least partially overlaps the pixel-defining layer in the thickness direction.

17. The display device of claim 16, wherein
the light-absorbing layer comprises:
a first light-absorbing layer overlapping the emissive layer in the thickness direction; and
a second light-absorbing layer not overlapping the emissive layer in the thickness direction, and
the pixel electrode is disposed between the first light-absorbing layer and the second light-absorbing layer.

18. The display device of claim 15, wherein the light-absorbing layer converts light energy of external light incident on the first display part and internal light emitted by the emissive layer into electrical energy.

19. The display device of claim 15, wherein the second display part comprises an auxiliary light-absorbing layer.

20. The display device of claim 19, wherein
the light-absorbing layer comprises:
a first light-absorbing layer overlapping the emissive layer in a thickness direction; and
a second light-absorbing layer not overlapping the emissive layer in the thickness direction,
the auxiliary light-absorbing layer comprises a first auxiliary light-absorbing layer and a second auxiliary light-absorbing layer overlapping the emissive layer in the thickness direction, and
a distance between the first light-absorbing layer and the second light-absorbing layer is smaller than a distance between the first auxiliary light-absorbing layer and the second auxiliary light-absorbing layer.

21. The display device of claim 1, wherein the pixel electrode is spaced apart from the light-absorbing layer.

* * * * *